US008987869B2

(12) United States Patent  
Jin et al.

(10) Patent No.: US 8,987,869 B2  
(45) Date of Patent: Mar. 24, 2015

(54) INTEGRATED CIRCUIT DEVICES INCLUDING THROUGH-SILICON-VIAS HAVING INTEGRAL CONTACT PADS

(71) Applicant: Samsung Electronics Co., Ltd., Suwon-si, Gyeonggi-do (KR)

(72) Inventors: Jeong-gi Jin, Gyeonggi-do (KR); Jeong-woo Park, Gyeonggi-do (KR); Ju-il Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 15 days.

(21) Appl. No.: 13/738,728

(22) Filed: Jan. 10, 2013

(65) Prior Publication Data

US 2013/0175673 A1 Jul. 11, 2013

(30) Foreign Application Priority Data

Jan. 11, 2012 (KR) .................. 10-2012-0003455

(51) Int. Cl.
*H01L 23/52* (2006.01)
*H01L 29/40* (2006.01)
(Continued)

(52) U.S. Cl.
CPC .............. *H01L 23/481* (2013.01); *H01L 24/11* (2013.01); *H01L 24/13* (2013.01); *H01L 21/76898* (2013.01); *H01L 23/3114* (2013.01); *H01L 2224/16225* (2013.01); *H01L 2225/06517* (2013.01); *H01L 2924/15311* (2013.01); *H01L 2225/06513* (2013.01); *H01L 2225/06565* (2013.01); *H01L 2225/06544* (2013.01); *H01L 2924/01327* (2013.01); *H01L 2924/13091* (2013.01); *H01L 2224/1161* (2013.01);

(Continued)

(58) Field of Classification Search
CPC ... H01L 23/481; H01L 23/3114; H01L 21/71; H01L 21/4885; H01L 24/11; H01L 24/13; H01L 24/16; H01L 23/5384; H01L 23/28; H01L 23/538; H01L 23/50; H01L 27/24; H01L 27/22; H05K 1/18
USPC .......... 257/621, 774, 777, E23.135, E23.174, 257/E21.577, E21.578, E21.585, 4, 421, 257/531, 659, 737, 772, E21.002, E23.011, 257/E23.068, E29.112, E23.145; 438/109, 438/629, 637, 638, 639, 640, 668, 672, 675, 438/614, 382, 113
See application file for complete search history.

(56) References Cited

U.S. PATENT DOCUMENTS

2002/0145191 A1 10/2002 Murayama et al.
2008/0029850 A1 2/2008 Hedler et al.
(Continued)

FOREIGN PATENT DOCUMENTS

JP 2005-347678 A 12/2005
KR 1020090132000 A 12/2009
(Continued)

*Primary Examiner* — Julio J Maldonado
*Assistant Examiner* — Moazzam Hossain
(74) *Attorney, Agent, or Firm* — Myers Bigel Sibley & Sajovec, PA

(57) ABSTRACT

An integrated circuit device including an interlayer insulating layer on a substrate, a wire layer on the interlayer insulating layer, and a through-silicon-via (TSV) contact pattern having an end contacting the wire layer and integrally extending from inside of a via hole formed through the interlayer insulating layer and the substrate to outside of the via hole.

5 Claims, 28 Drawing Sheets

(51) Int. Cl.
  *H01L 29/82* (2006.01)
  *H01L 23/48* (2006.01)
  *H01L 23/00* (2006.01)
  *H01L 21/768* (2006.01)
  *H01L 23/31* (2006.01)

(52) U.S. Cl.
  CPC ............ *H01L2224/1369* (2013.01); *H01L 2224/81011* (2013.01); *H01L 24/16* (2013.01); *H01L 2221/6835* (2013.01); *H01L 2224/11462* (2013.01); *H01L 2224/1162* (2013.01); *H01L 2224/13009* (2013.01); *H01L 2224/13022* (2013.01); *H01L 2224/13082* (2013.01); *H01L 2224/13111* (2013.01); *H01L 2224/13113* (2013.01); *H01L 2224/13116* (2013.01); *H01L 2224/13139* (2013.01); *H01L 2224/13144* (2013.01); *H01L 2224/13147* (2013.01); *H01L 2224/13155* (2013.01); *H01L 2224/13562* (2013.01); *H01L 2224/13611* (2013.01); *H01L 2224/13613* (2013.01); *H01L 2224/13639* (2013.01); *H01L 2224/13644* (2013.01); *H01L 2224/13655* (2013.01); *H01L 2224/14181* (2013.01); *H01L 2224/16146* (2013.01); *H01L 2224/13616* (2013.01); *H01L 2224/11009* (2013.01); *H01L 2224/11002* (2013.01)
  USPC ............ 257/621; 257/774; 257/E23.011; 257/E29.112; 257/E21.577; 438/629; 438/675; 438/638

(56) References Cited

U.S. PATENT DOCUMENTS

| | | |
|---|---|---|
| 2009/0026614 A1 | 1/2009 | Jung |
| 2010/0144094 A1* | 6/2010 | Chen et al. .................... 438/109 |
| 2010/0155940 A1* | 6/2010 | Kawashita et al. ........... 257/737 |
| 2010/0171223 A1 | 7/2010 | Kuo et al. |
| 2010/0297844 A1* | 11/2010 | Yelehanka et al. ............ 438/667 |
| 2011/0089551 A1 | 4/2011 | Ishihara et al. |
| 2011/0316168 A1* | 12/2011 | Moon et al. ................... 257/774 |

FOREIGN PATENT DOCUMENTS

| | | |
|---|---|---|
| KR | 1020100019634 A | 2/2010 |
| KR | 1020100030024 A | 3/2010 |
| KR | 1020110001168 A | 1/2011 |
| KR | 1020110004112 A | 1/2011 |

* cited by examiner

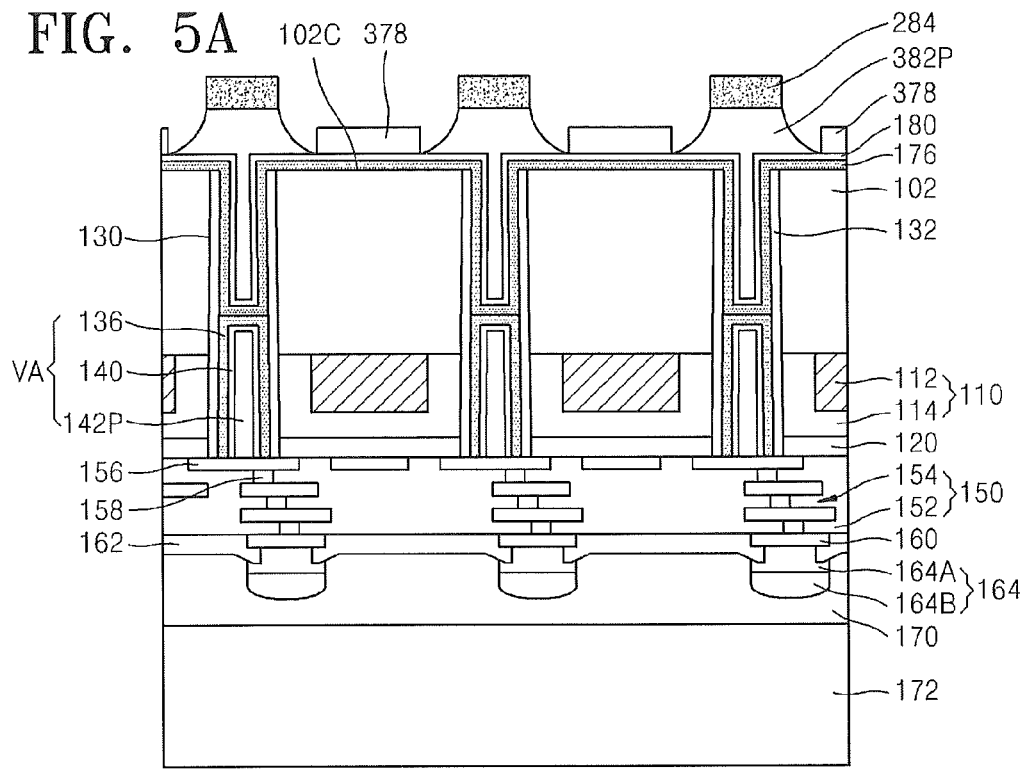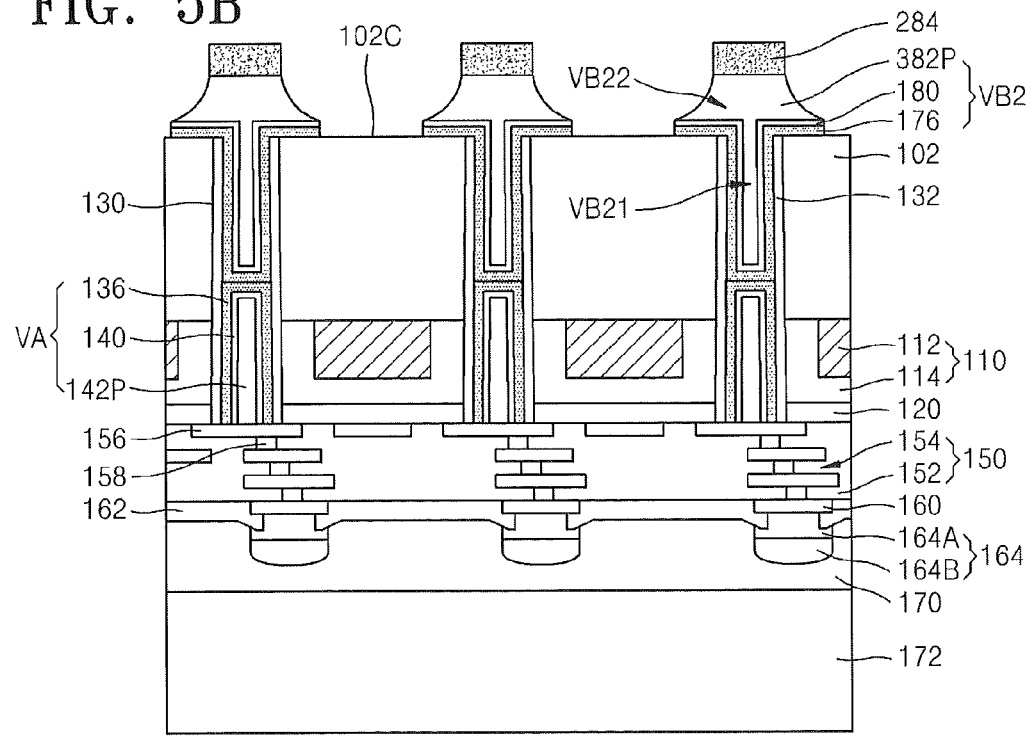

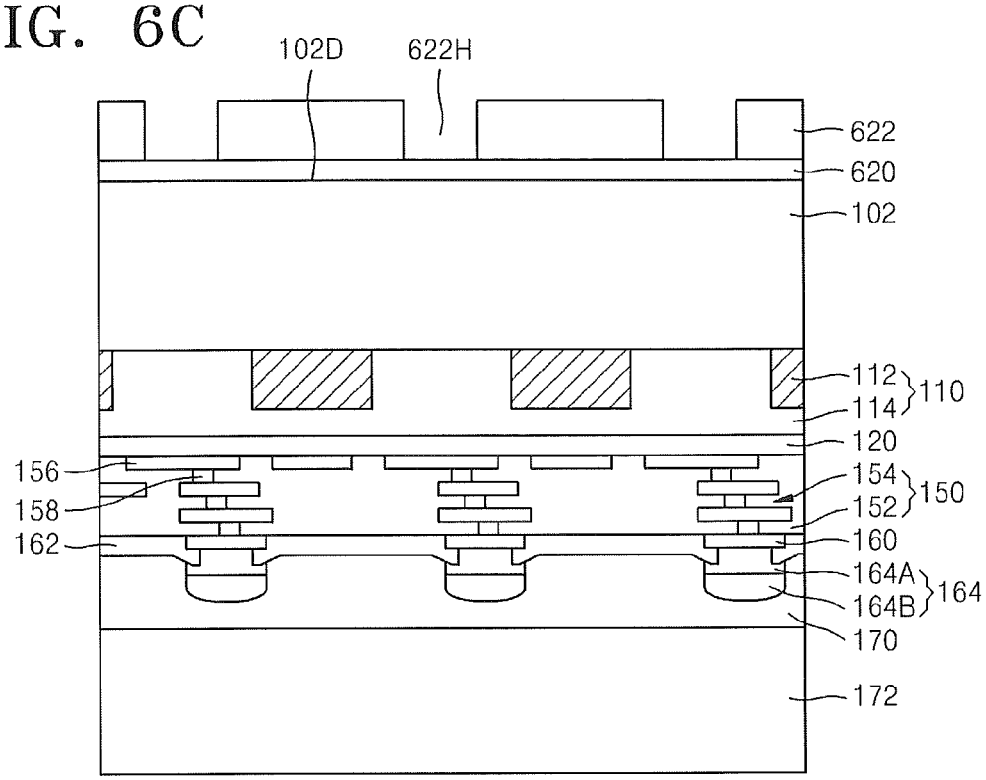
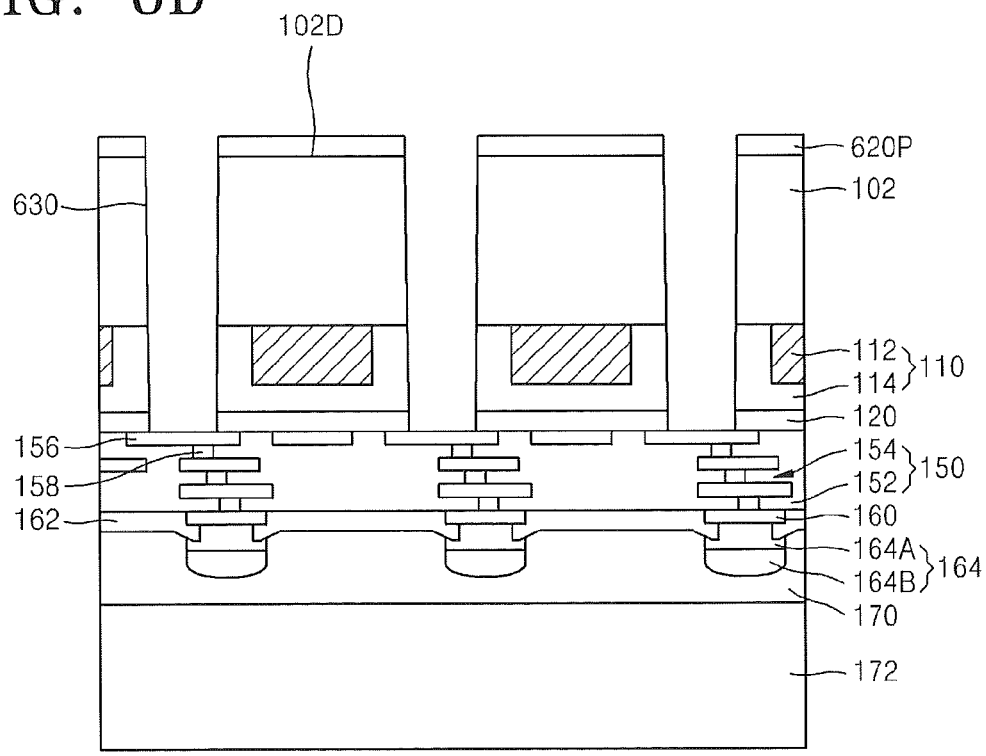

INTEGRATED CIRCUIT DEVICES INCLUDING THROUGH-SILICON-VIAS HAVING INTEGRAL CONTACT PADS

CROSS-REFERENCE TO RELATED APPLICATIONS

This application claims priority under 35 USC §119 to Korean Patent Application No. 10-2012-0003455, filed on Jan. 11, 2012, in the Korean Intellectual Property Office, the disclosure of which is incorporated herein in its entirety by reference.

BACKGROUND

The inventive concept relates to an integrated circuit device, and more particularly, to an integrated circuit device including a through-silicon-via (TSV) contact pattern.

As three-dimensional (3D) packages in which a plurality of semiconductor chips is mounted in a single semiconductor package have been actively developed, TSVs may be recognized as an important developing technology. TSVs utilize vertical electrical connections, which pass through a substrate or a die. To improve performance and reliability of 3D packages, forming more stable TSV contact structures may be of benefit.

SUMMARY

The inventive concept provides an integrated circuit device that is stable and has improved reliability in an electrical contact structure using a through-silicon-via (TSV).

According to some aspects of the inventive concept, an integrated circuit device includes a substrate, an interlayer insulating layer on the substrate, at least one conductive wiring pattern on the interlayer insulating layer, and a conductive via structure extending through the substrate and the interlayer insulating layer to contact the at least one wiring pattern. The conductive via structure includes a unitary member that extends from within the substrate onto a surface of the substrate opposite the interlayer insulating layer to define an integral contact pad on the surface of the substrate.

In some embodiments, sidewalls of the integral contact pad may be tapered in a direction away from the substrate.

In some embodiments, a protective layer may be provided on the contact pad. The protective layer may include an insulating or conductive material configured to protect the contact pad from oxidation.

In some embodiments, the integral contact pad may mechanically bond the substrate to a conductive bump structure of another substrate in a multi-chip package. The conductive bump structure and the protective layer may include respective materials that are configured to react when in contact.

In some embodiments, the unitary member may include a first conductive pattern, a first barrier pattern, and a first seed layer therebetween in a via hole extending through the substrate and the interlayer insulating layer.

In some embodiments, the unitary member may be a first portion of the conductive via structure. The conductive via structure may further include a second portion including a second conductive pattern, a second barrier pattern, and a second seed layer therebetween. The second portion may be confined within the via hole, and opposing ends of the second portion may contact the first portion and the at least one wiring pattern, respectively.

In some embodiments, the unitary member may define an entirety of the conductive via structure.

In some embodiments, the surface of the substrate including the contact pad thereon may be a backlapped surface. The contact pad may extend directly on the backlapped surface.

In some embodiments, the interlayer insulating layer may be part of a front-end-of-line (FEOL) structure, and the at least one wiring pattern may be part of a back-end-of-line (BEOL) structure. A conductive bump structure that is not aligned with the conductive via structure may be provided on the BEOL opposite the FEOL. The at least one wiring pattern may electrically connect the conductive via structure and the conductive bump structure.

According to an aspect of the inventive concept, there is provided an integrated circuit device including a substrate; an interlayer insulating layer formed on the substrate; a wire layer formed on the interlayer insulating layer; and a through-silicon-via (TSV) contact pattern having an end contacting the wire layer and integrally extending from the inside of a via hole penetrating both the interlayer insulating layer and the substrate to the outside of the via hole.

In some embodiments, the TSV contact pattern may include an internal plug part filling at least a portion of an inner space of the via hole and an external pad part being integrally connected to the internal plug part and protruding from a backside of the substrate to an external side of the substrate, wherein the external pad part tapers away from the backside of the substrate.

In some embodiments, the integrated circuit device may further include a pad protective layer including a different material from that of the external pad part and covering at least a portion of the external pad part.

According to another aspect of the inventive concept, there is provided an integrated circuit device including: a first semiconductor chip including a first substrate and a bump formed on the first substrate; and a second semiconductor chip including a second substrate, an interlayer insulating layer formed on the second substrate, a wire layer formed on the interlayer insulating layer, and a through-silicon-via (TSV) contact pattern having an end contacting the wire layer, the TSV contact pattern integrally extending from an inside of a via hole formed through the interlayer insulating layer and through the second substrate to an outside of the via hole, and being electrically connected to the bump of the first semiconductor chip, wherein the TSV contact pattern includes an internal plug part filling at least a portion of an inner space of the via hole, and an external pad part being integrally connected to the internal plug part, protruding from a backside of the substrate to an external side of the substrate, and having a width that tapers away from the backside of the substrate, and wherein at least a portion of the external pad part is inserted into the bump of the first semiconductor chip.

BRIEF DESCRIPTION OF THE DRAWINGS

Example embodiments of the inventive concept will be more clearly understood from the following detailed description taken in conjunction with the accompanying drawings in which:

FIGS. 5A through 5C are cross-sectional views illustrating a method of manufacturing an integrated circuit device according to embodiments of the inventive concept;

FIGS. 6A through 6J are cross-sectional views illustrating a method of manufacturing an integrated circuit device according to embodiments of the inventive concept;

DETAILED DESCRIPTION OF THE EMBODIMENTS

Figure 1:
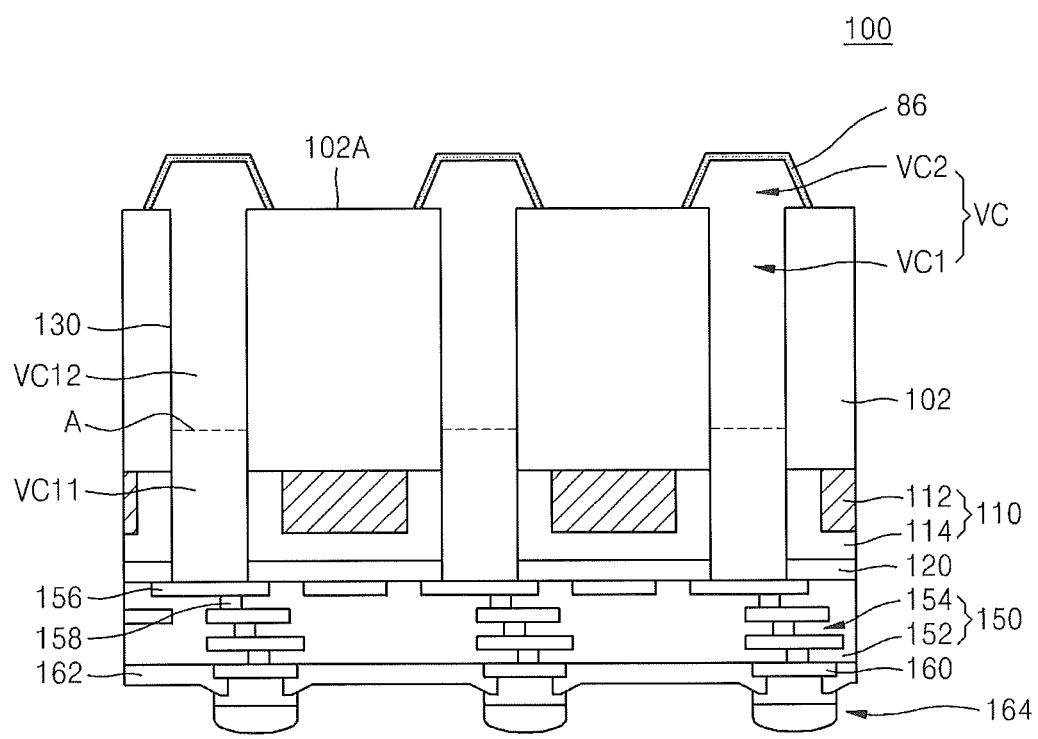
FIG. 1 is a cross-sectional view illustrating elements of an integrated circuit device according to embodiments of the inventive concept.

Hereinafter, one or more embodiments of the inventive concept will be described in detail with reference to the accompanying drawings. Like reference numerals in the drawings denote like elements, and a detailed description thereof is provided once. As used herein, the term "and/or" includes any and all combinations of one or more of the associated listed items. Expressions such as "at least one of," when preceding a list of elements, modify the entire list of elements and do not modify the individual elements of the list.

The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art.

It will be understood that, although the terms "first", "second", etc. may be used herein to describe various elements, components, regions, layers and/or sections, these elements, components, regions, layers and/or sections should not be limited by these terms. These terms do not indicate a specific order, above and below, or level of importance, and are only used to distinguish one element, component, region, layer or section from another element, component, region, layer or section. Thus, a first element, component, region, layer or section discussed below could be termed a second element, component, region, layer or section without departing from the teachings of exemplary embodiments.

As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or elements, but do not preclude the presence or addition of one or more other features, integers, steps, operations, elements, elements, and/or groups thereof.

It will be understood that when an element or layer is referred to as being "on," "connected to," "coupled to," or "adjacent" another element or layer, it can be directly on, connected to, coupled to, or adjacent the other element or layer, or intervening elements or layers may be present. In contrast, when an element is referred to as being "directly on," "directly connected to," "directly coupled to," or "directly adjacent" another element or layer, there are no intervening elements or layers present.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented and the spatially relative descriptors used herein interpreted accordingly.

All terms used herein including technical or scientific terms have the same meaning as those generally understood by those of ordinary skill in the art unless they are defined differently. It should be understood that terms generally used, which are defined in a dictionary, have the same meaning as in the context of the related technology, and the terms should not be understood as having an ideal or excessively formal meaning unless they are clearly defined in the application.

In a case in which an embodiment can be embodied differently, specific processes may be performed in a different order from the described order. For example, two consecutive processes described in the specification may be simultaneously performed or may be performed in a different order from the described order.

In the accompanying drawings, variations from the shapes of the illustrations as a result, for example, of manufacturing techniques and/or tolerances, are to be expected. Thus, embodiments of the inventive concept should not be construed as limited to the particular shapes of regions illustrated herein but may be to include deviations in shapes that result, for example, from manufacturing.

FIG. 1 is a cross-sectional view illustrating elements of an integrated circuit device 100 according to some embodiments of the inventive concept.

The integrated circuit device 100 includes a substrate 102, an interlayer insulating layer 114 formed on the substrate 102, a plurality of metal wire layers 156 formed on the interlayer insulating layer 114, and through-silicon-via (TSV) contact patterns VCs (also referred to herein as "conductive via structures") each having an end that contacts one of the plurality of metal wire layers 156 and integrally extending from the inside of a via hole 130 that penetrates the interlayer insulating layer 114 and the substrate 102 to the outside of the via hole 130.

The TSV contact pattern VC is a unitary member including an internal plug part VC1 that fills at least a portion of the inner space of the via hole 130 and an external pad part VC2 that is integrally connected to the internal plug part VC1 and protrudes to the outside of the substrate 102 from a backside 102A of the substrate 102. As such, the external pad part VC2 defines a contact pad on the surface of the substrate 102, where the contact pad is integral to the conductive via structure VC. The external pad part VC2 tapers in a direction away from the backside 102A of the substrate 102.

In some embodiments, the internal plug part VC1 of the TSV contact pattern VC contacts one of the plurality of metal wire layers 156 inside the via hole 130 and has a shape so as to extend integrally from an end of the internal plug part VC1 that contacts the metal wire layer 156 in the via hole 130 to the backside 102A of the substrate 102. In some embodiments, the internal plug part VC1 of the TSV contact pattern VC may include a conductive pattern, a barrier layer surrounding the conductive pattern, and a seed layer interposed between the conductive pattern and the barrier layer. A detailed description of the conductive pattern, the barrier layer, and the seed layer will be described below with reference to FIGS. 2A through 7B.

In other embodiments, the internal plug part VC1 includes a first TSV contact pattern VC11 that contacts the metal wire layer 156 and extends from the metal wire layer 156 to a position represented by a dotted line A in the via hole 130 so as to fill a portion of the inner space of the via hole 130, and a second TSV contact pattern VC12 that contacts the first TSV contact pattern VC11 at the position represented by the dotted line A and extends to fill the remaining portion of the inner space of the via hole 130. In the via hole 130, a contact position between the first TSV contact pattern VC11 and the second TSV contact pattern VC12 is not limited to the position represented by the dotted line A illustrated in FIG. 1. For example, the contact position between the first TSV contact pattern VC11 and the second TSV contact pattern VC12 may be located in the proximity of the backside 102A of the substrate 102. Alternatively, the contact position between the first TSV contact pattern VC11 and the second TSV contact pattern VC12 may be located at a closer position to the metal wire layer 156 than the dotted line A.

In some embodiments, the first TSV contact pattern VC11 may include a first conductive pattern, a first barrier layer surrounding the first conductive pattern, and a first seed layer interposed between the first conductive pattern and the first barrier layer. In addition, the second TSV contact pattern VC12 may include a second conductive pattern, a second barrier layer surrounding the second conductive pattern, and a second seed layer interposed between the second conductive pattern and the second barrier layer. The first TSV contact pattern VC11 and the second conductive pattern may face each other, with the second barrier layer and the second seed layer therebetween. A detailed description of the first and second conductive patterns, the first and second barrier layers, and the first and second seed layers will be provided below with reference to FIGS. 2A through 7B.

At least a portion of the external pad part VC2 may be covered by a pad protective layer 86. Referring to FIG. 1, the pad protective layer 86 completely covers a surface of the external pad part VC2 which protrudes from the substrate 102, but is not limited thereto. In some embodiments, the pad protective layer 86 may partially cover the exposed surfaces of the external pad part VC2. For example, the pad protective layer 86 may cover a side surface of the external pad part CV2. Also, the pad protective layer 86 may cover a top surface and a side surface of the external pad part VC2.

The pad protective layer 86 may be formed of a different material from that of the external pad part VC2. In some embodiments, the external pad part VC2 includes Cu. In another embodiment, the external pad part VC2 includes a barrier layer formed of at least one material selected from Ti, TiN, Ta, and TaN, a seed layer having a stacked structure formed of Ta/Cu or Ti/Cu, and a conductive pattern including Cu. The pad protective layer 86 may be formed of an insulating organic material. For example, the pad protective layer 86 may be formed of an azole compound or an azole compound including Cu. Also, the pad protective layer 86 may be formed of a metal. For example, the pad protective layer 86 may be formed of Ni, Pd, Au, Sn, Ag, Pb, Bi, or a combination thereof. The thickness of the pad protective layer 86 may be in the range of about 0.01 to about 1.0 micrometers (μm).

In the integrated circuit device 100, the interlayer insulating layer 114 partially constitutes a front-end-of-line (FEOL) structure 110. The FEOL structure 110 may further include a plurality of integrated circuit units or elements 112 including a plurality of various kinds of individual devices, each of which includes a portion insulated by the interlayer insulating layer 114. In some embodiments, the plurality of integrated circuit units or elements 112 may be various kinds of microelectronic devices, for example, a metal-oxide-semiconductor field effect transistor (MOSFET) such as a complementary metal-insulator-semiconductor (CMOS) transistor, a dynamic random access memory (DRAM), a static RAM (SRAM), a flash memory, an electrically erasable programmable read-only memory (EEPROM), a phase-change random access memory (PRAM), a magnetic RAM (MRAM), a resistive RAM (RRAM), a large scale integration (LSI) system, an image sensor such as a CMOS imaging sensor (CIS), a micro-electro-mechanical system (MEMS), an active element, and a passive element. The plurality of integrated circuit units 112 may be electrically connected to a conductive region of the substrate 102. In addition, each of the plurality of integrated circuit units 112 may be electrically disconnected or otherwise electrically insulated from other adjacent individual devices by the interlayer insulating layer 114. In the accompanying drawings, the interlayer insulating layer 114 is illustrated as a single layer, but is not limited thereto. For example, the interlayer insulating layer 114 may have a stacked structure including at least one layer selected from an oxide layer, a nitride layer, and a high-k dielectric layer having a higher dielectric constant than that of a silicon oxide layer.

The integrated circuit device 100 further includes a back-end-of-line (BEOL) structure 150 formed on the FEOL structure 110. The BEOL structure 150 includes a metal or wiring interlayer insulating layer 152 and a plurality of multi-layered wire patterns 154, each of which includes a portion insulated by the wiring interlayer insulating layer 152. The plurality of metal wire layers 156 partially define or constitute the plurality of multi-layered wire patterns 154. Each of the multi-layered wire patterns 154 includes the plurality of metal wire layers 156 and a plurality of contact plugs 158.

The BEOL structure 150 may include a plurality of wire structures that connect the individual devices formed in the integrated circuit units 112 of the FEOL structure 110 to other wires formed on the substrate 102. In some embodiments, the BEOL structure 150 may further include a seal ring for protecting the wire structures and other structures disposed below the wire structures from external impacts or moisture.

Also, an etch stop layer 120 may be interposed between the FEOL structure 110 and the BEOL structure 150. The etch stop layer 120 may be a silicon nitride layer. In some embodiments, the etch stop layer 120 may not be formed.

The via holes 130 are formed by penetrating the substrate 102, the FEOL structure 110, and the etch stop layer 120, and the internal plug part VC1 of the TSV contact pattern VC is formed to extend inside the via hole 130 to correspond to the total length of the via hole 130.

A plurality of contact pads 160 are formed on the wiring interlayer insulating layer 152 and are respectively electrically connected to the plurality of multi-layered wire patterns 154. A passivation layer 162 is further formed on the BEOL structure 150 so as to expose a portion of each of the plurality of contact pads 160. A plurality of bumps 164 are respectively electrically connected to the plurality of contact pads 160 that are exposed via the passivation layer 162.

Figure 2A:
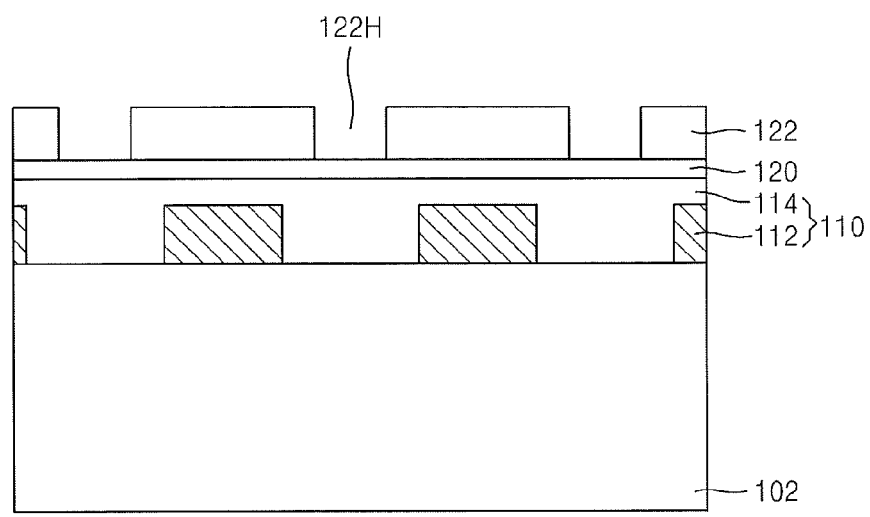
FIGS. 2A through 2P are cross-sectional views illustrating a method of manufacturing an integrated circuit device according to embodiments of the inventive concept.
Figure 2B:
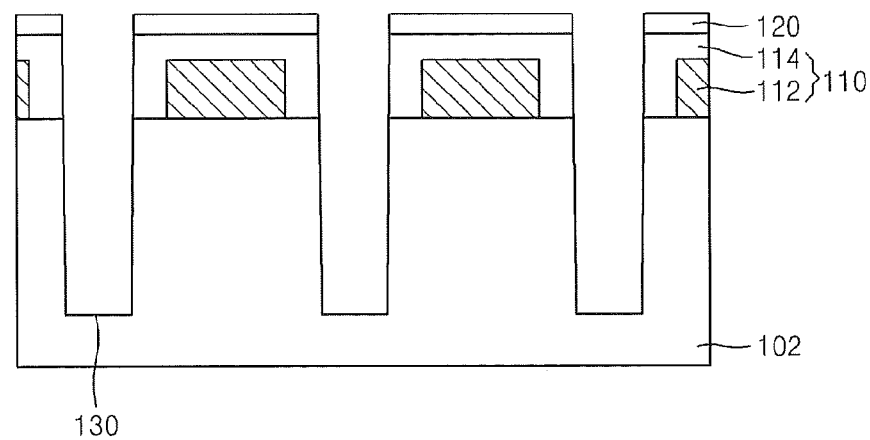
Figure 2C:
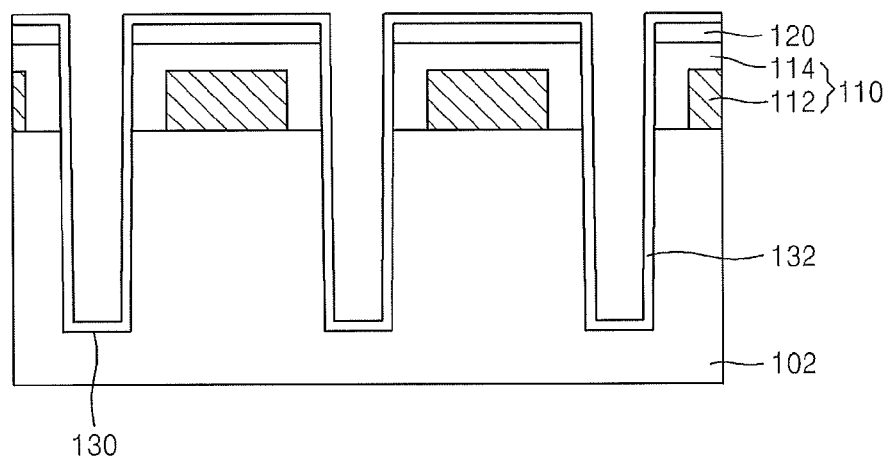
Figure 2D:
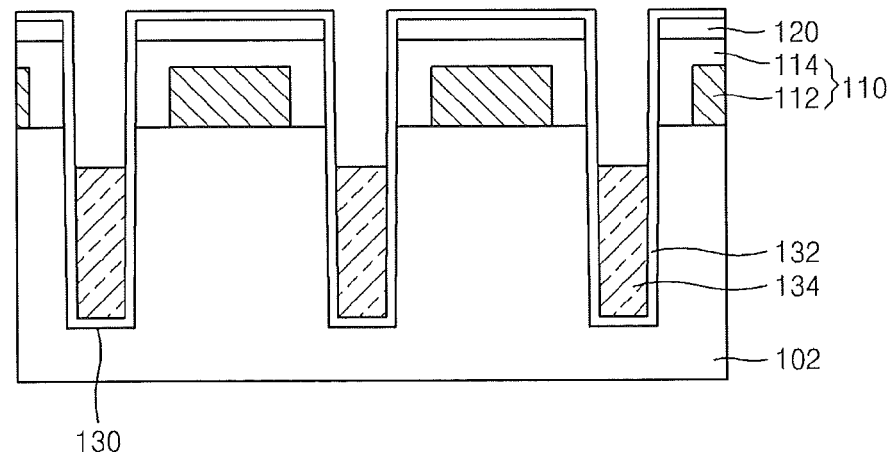
Figure 2E:
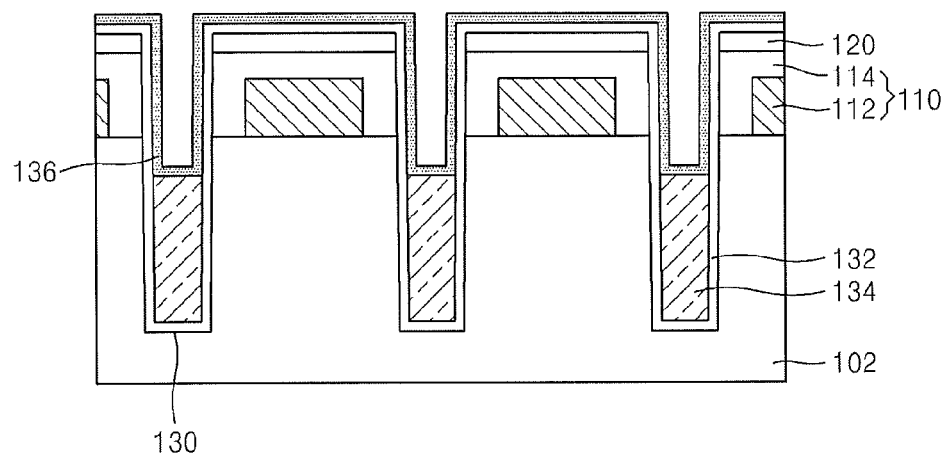
Figure 2F:
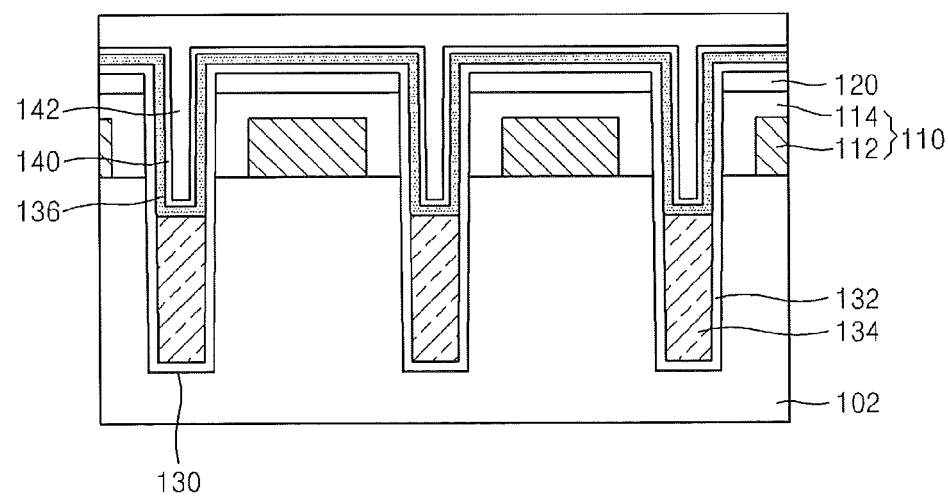
Figure 2G:
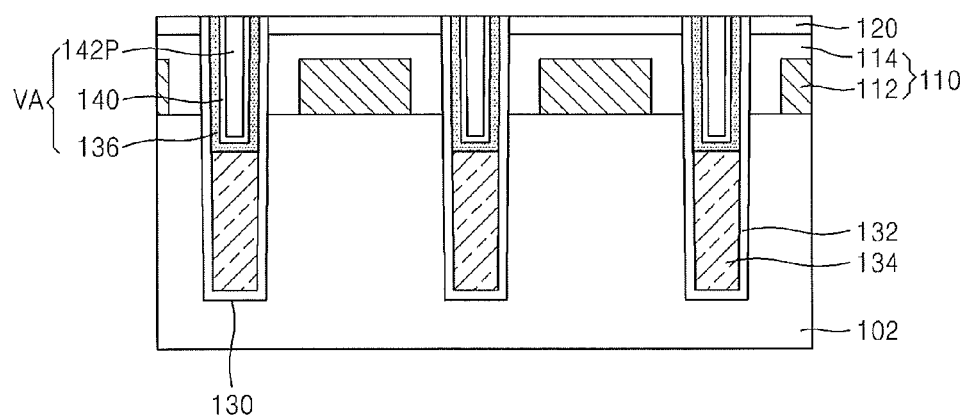
Figure 2H:
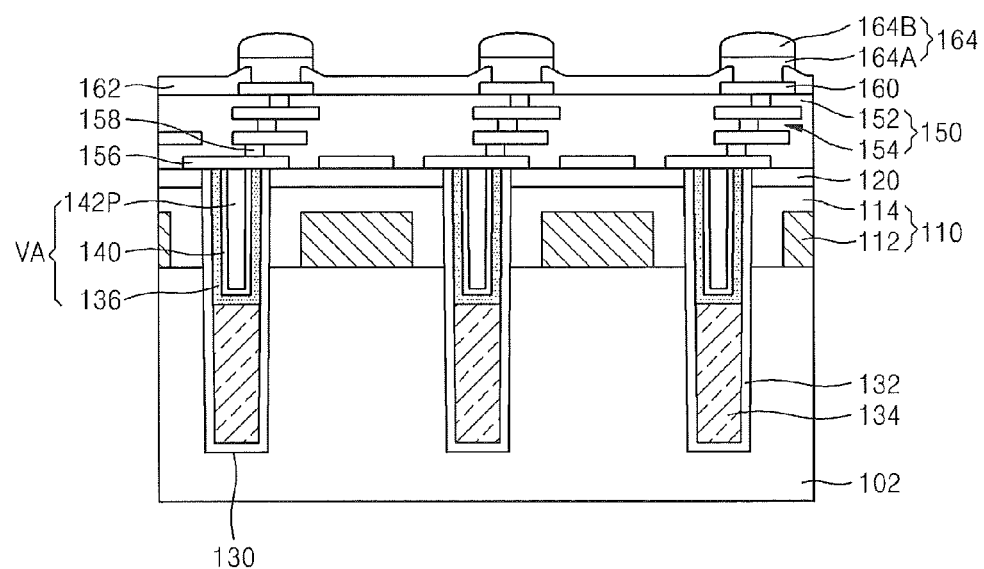
Figure 2I:
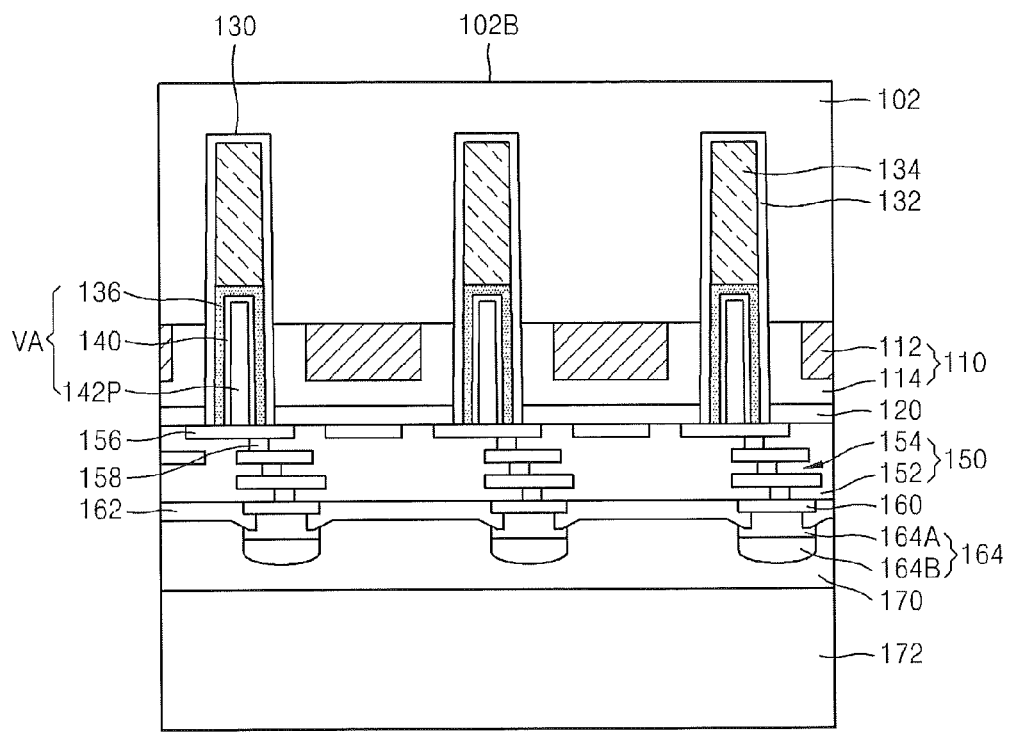
Figure 2J:
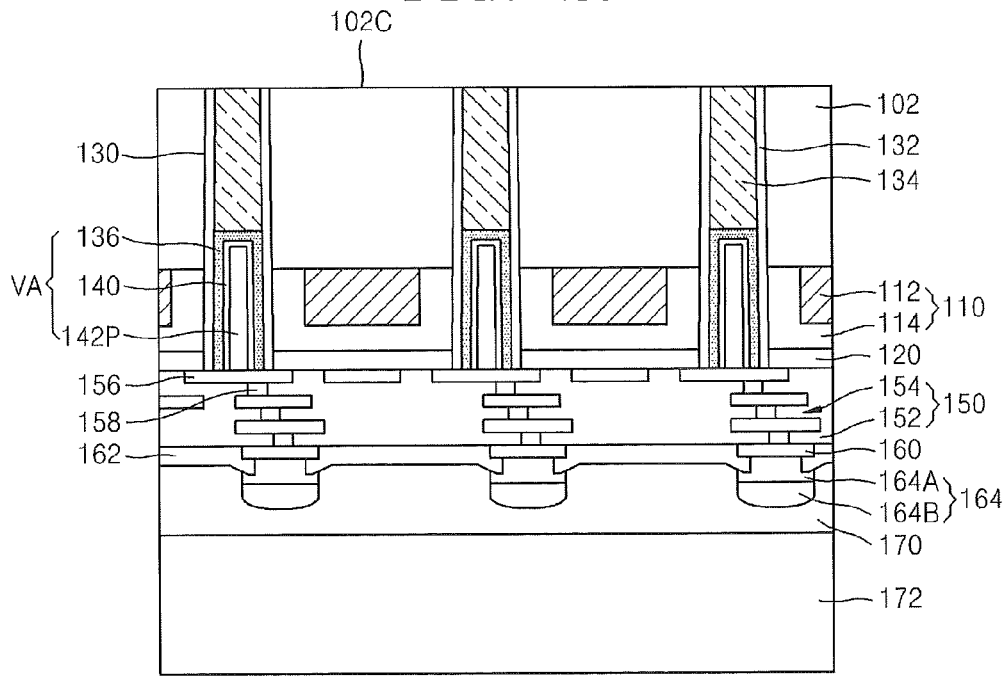
Figure 2K:
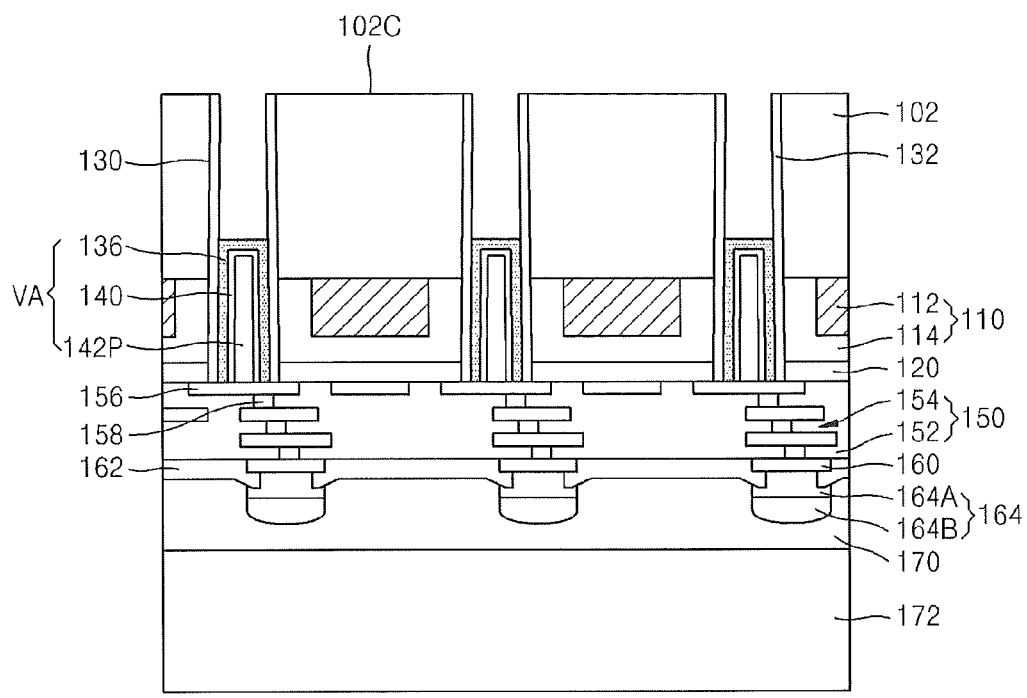
Figure 2L:
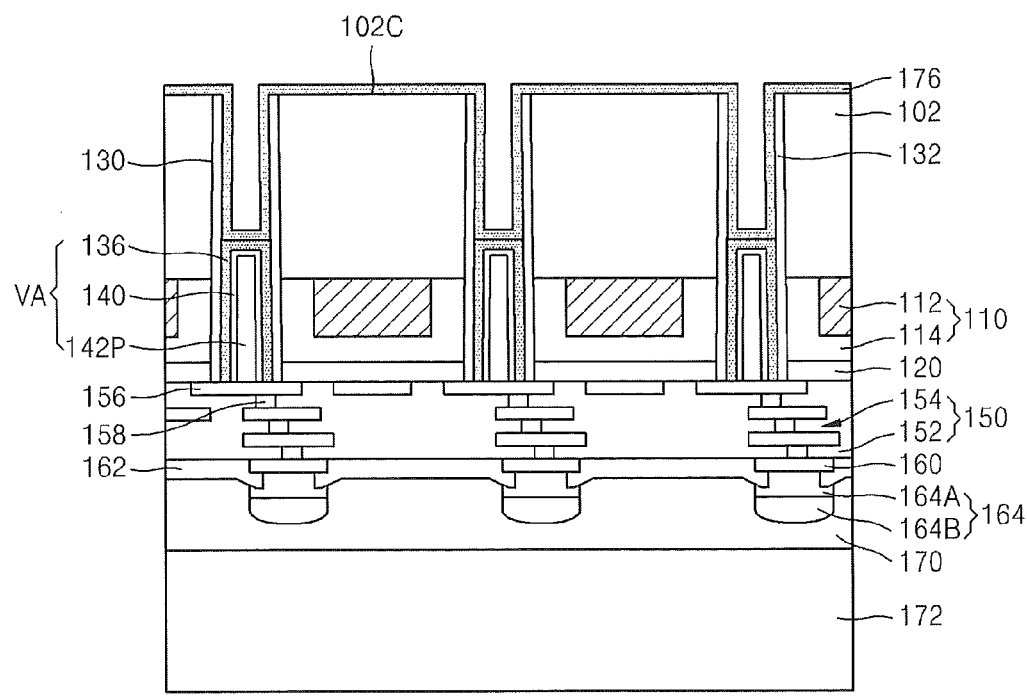
Figure 2M:
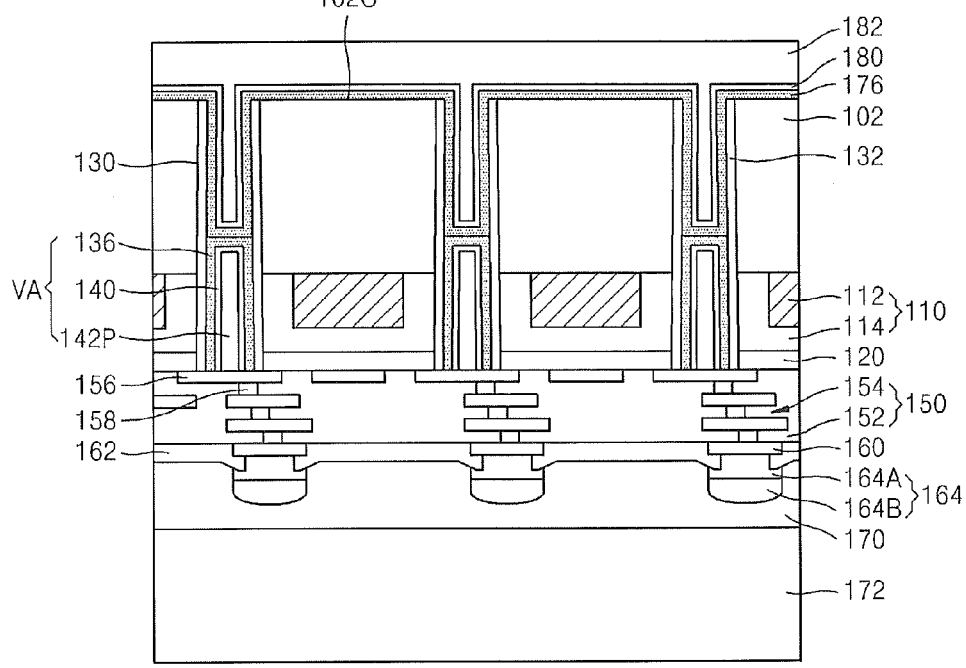
Figure 2N:
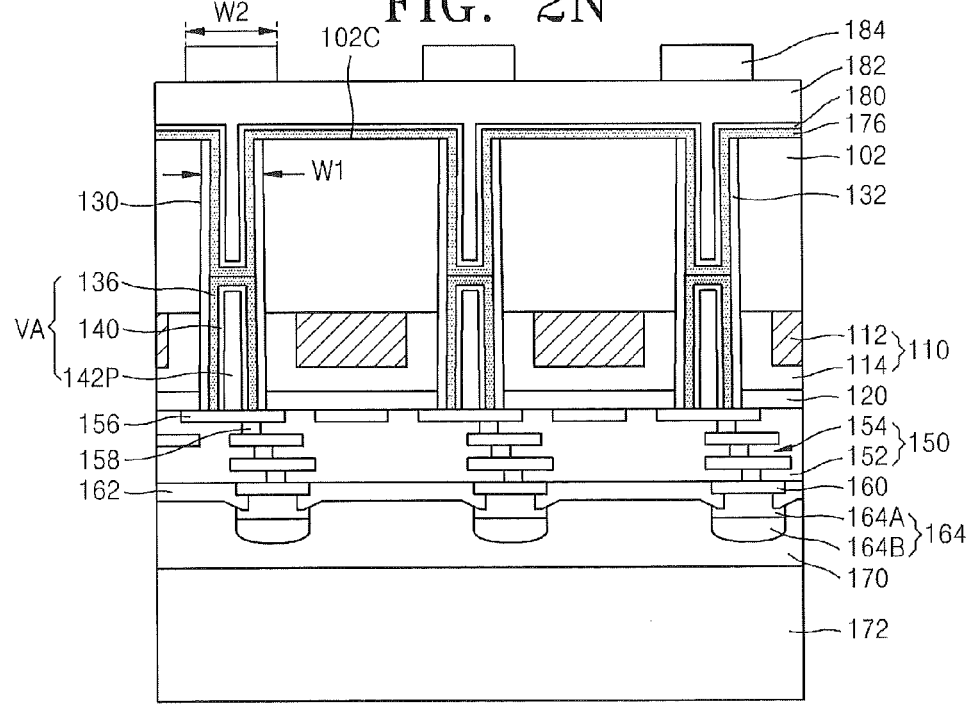
Figure 20:
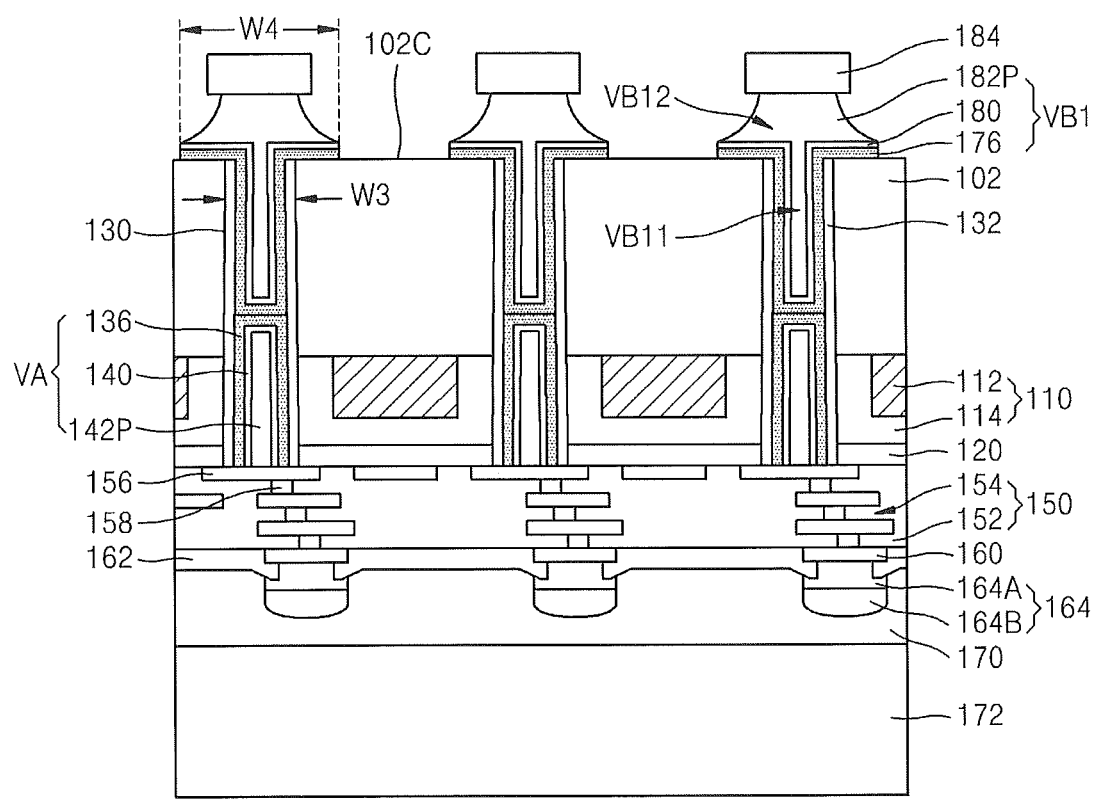
Figure 2P:
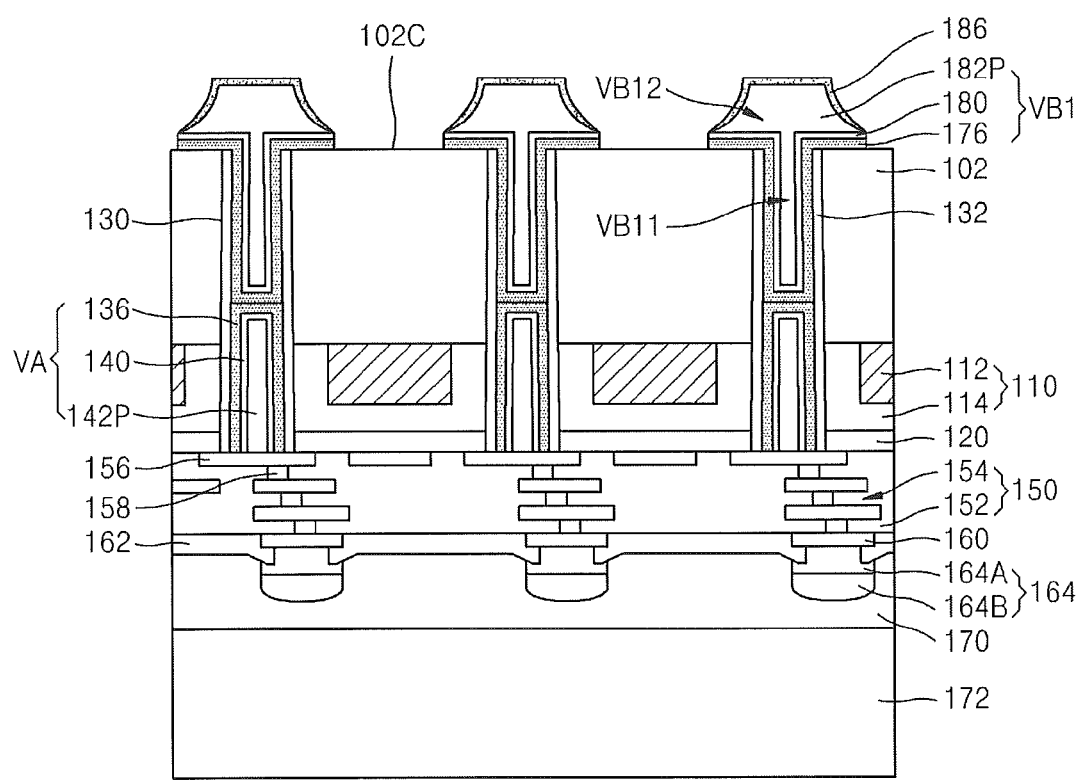

FIGS. 2A through 2P are cross-sectional views illustrating a method of manufacturing an integrated circuit device 200 (see FIG. 2P) according to embodiments of the inventive concept. In FIGS. 2A through 2P, like reference numerals denote like elements as in FIG. 1, and a detailed description thereof will not be repeated herein to avoid redundancy.

Referring to FIG. 2A, an FEOL structure 110 is formed on a substrate 102, an etch stop layer 120 is formed on the FEOL structure 110, and a mask pattern 122 is formed on the etch stop layer 120. The mask pattern 122 has at least one hole 122H to expose a portion of a top surface of the etch stop layer 120.

In some embodiments, the substrate 102 may be a semiconductor wafer. In some embodiments, the substrate 102 may be formed of silicon (Si). In another embodiment, the substrate 102 may be formed of a semiconductor element such as germanium (Ge) or a compound semiconductor such as silicon carbide (SiC), gallium arsenide (GaAs), indium arsenide (InAs), or indium phosphide (InP). In some embodiments, the substrate 102 may have a silicon-on-insulator (SOI) structure. For example, the substrate 102 may include a buried oxide (BOX) layer. In some embodiments, the substrate 102 may include a conductive region, for example, a well doped with impurities or a structure doped with impurities. In addition, the substrate 102 may have various kinds of element isolation structures such as shallow trench isolation (STI) structures.

The etch stop layer 120 may have a thickness ranging from about 200 to about 1,000 Angstroms (Å). The etch stop layer 120 may be formed by chemical vapor deposition (CVD).

The mask pattern 122 may consist of a photoresist material.

Referring to FIG. 2B, the etch stop layer 120 and the interlayer insulating layer 114 are etched using the mask pattern 122 (refer to FIG. 2A) as an etching mask, and the substrate 102 is then partially etched to form via holes 130. The via holes 130 have shapes formed by penetrating the interlayer insulating layer 114 of the FEOL structure 110 and extending in the substrate 102 in a thickness direction of the substrate 102 to a predetermined length.

The via holes 130 may be formed using an anisotropic etching process or by laser drilling. The width and depth of the via holes 130 are not limited to the examples illustrated in the accompanying drawings, and, if desired, via holes 130 with various sizes may be formed.

After the formation of the via holes 130, the mask pattern 122 (refer to FIG. 2A) is removed to expose a top surface of the etch stop layer 120.

Referring to FIG. 2C, an insulating layer 132 is formed to cover inner sidewalls and a bottom surface of the via hole 130.

The insulating layer 132 may be formed to cover surfaces of the substrate 102 that are exposed inside the via holes 130, surfaces of the interlayer insulating layer 114 that are exposed inside the via holes 130, and surfaces of the etch stop layer 120. In some embodiments, the insulating layer 132 may be a silicon oxide layer. The insulating layer 132 may be formed by CVD.

Referring to FIG. 2D, a sacrificial pattern 134 is formed to fill a portion of the inner space of the via hole 130 from a bottom surface of the via hole 130 to a predetermined thickness.

The sacrificial pattern 134 may consist of various materials. For example, a material for forming the sacrificial pattern 134 may be a material capable of filling the inside of a narrow, deep hole with a relatively large aspect ratio and a relatively small diameter. In some embodiments, the sacrificial pattern 134 may have a height that is approximately a half or less of the total length in a thickness direction of the substrate 102.

The sacrificial pattern 134 may be formed of at least one selected from a polymer, a photoresist material, a nitride layer, and an oxide layer. For example, the sacrificial pattern 134 may be formed of a polymer such as benzocyclobutene (BCB). In some embodiments, the sacrificial pattern 134 may be formed of a material having a high etching selectivity in comparison with the insulating layer 132.

The sacrificial pattern 134 may be formed by spin coating. Alternatively, the sacrificial pattern 134 may be formed by forming a sacrificial layer that fills the inside of the via holes 130 by CVD, physical vapor deposition (PVD), or atomic layer deposition (ALD) and removing a portion of the sacrificial layer by performing an etch-back process to form the sacrificial pattern 134 including the remaining portion of the sacrificial layer.

Referring to FIG. 2E, a first barrier layer 136 is formed in the via holes 130.

The first barrier layer 136 covers the insulating layer 132 and the sacrificial pattern 134 inside the via holes 130. In the present embodiment, the first barrier layer 136 is formed on the insulating layer 132 so as to extend to the outside of the via holes 130, but is not limited thereto. In some embodiments, the first barrier layer 136 may be formed only inside the via holes 130.

In some embodiments, the first barrier layer 136 may include at least one material selected from Ti, TiN, Ta, and TaN. In some embodiments, the first barrier layer 136 may be formed by PVD. The first barrier layer 136 may include portions having different thicknesses. For example, outside the via holes 130, the first barrier layer 136 may be formed on the insulating layer 132 to a thickness ranging from about 1,000 to about 2,000 Å. In addition, inside the via holes 130, the first barrier layer 136 may be formed on the insulating layer 132 to a thickness ranging from about 40 to about 50 Å.

Referring to FIG. 2F, a first seed layer 140 and a first conductive layer 142 are sequentially formed on the first barrier layer 136 inside the via holes 130.

The first seed layer 140 is formed to cover the first barrier layer 136 inside and outside the via holes 130. The first seed layer 140 may have a stacked structure formed of Ta/Cu or Ti/Cu. The first seed layer 140 may be formed by PVD.

The first conductive layer 142 is formed on the first barrier layer 136 to a thickness sufficient enough to cover the via holes 130. The first conductive layer 142 may be formed of Cu. For example, a Cu film may be formed as the first conductive layer 142 on a surface of the first seed layer 140 by using an electroplating process. Alternatively, the first conductive layer may be formed of W or Al. In this case, the first seed layer 140 may not be formed. In other words, the first conductive layer 142 may be directly formed on the first barrier layer 136 by PVD.

An aspect ratio of a space that is filled by the first seed layer 140 and the first conductive layer 142 inside the via holes 130 can be significantly smaller than that of whole space of the via holes 130. Therefore, when the first seed layer 140 and the first conductive layer 142 are formed, problems such as delamination thereof may not occur and the inner space of the via holes 130 may be satisfactorily or sufficiently filled by the first seed layer 140 and the first conductive layer 142.

Referring to FIG. 2G, a resultant structure including the first conductive layer 142 is polished by chemical mechanical polishing (CMP) by using the etch stop layer 120 as a stopper to form a plurality of first conductive patterns 142P that fill the inside of the via holes 130.

As a result, a plurality of first TSV contact patterns VA each including the first barrier layer 136, the first seed layer 140, and the first conductive pattern 142P are formed in the via holes 130. Each first TSV contact pattern VA is formed inside a respective via hole 130 so as to fill a portion of each via hole 130 from an open end thereof and has an approximately smooth top surface on the side of the open end of the via hole 130.

Referring to FIG. 2H, a BEOL structure 150 is formed on the first conductive patterns 142P and the etch stop layer 120. The BEOL structure 150 includes a wiring interlayer insulating layer 152 and a plurality of multi-layered wire patterns 154 each including a portion insulated by the wiring interlayer insulating layer 152.

At least a portion of the plurality of multi-layered wire patterns 154 is electrically connected to the first conductive patterns 142P. Each of the multi-layered wire patterns 154 includes a plurality of metal wire layers 156 and a plurality of contact plugs 158.

In FIG. 2H, it is illustrated that each of the multi-layered wire patterns 154 includes three metal wire layers 156 and three contact plugs 15. However, this example is provided only for illustrative purposes for convenience of explanation, and is not intended to limit the scope of the inventive concept. In addition, a connecting structure between the metal wire layers 156 and the contact plugs 158 of the multi-layered wire patterns 154 is provided only for illustrative purposes, but is not limited to the example illustrated in FIG. 2H.

In some embodiments, the metal wire layers 156 and the contact plugs 158 may include at least one metal selected from W, Al, and Cu. The metal wire layers 156 and the contact plugs 158 may be formed of the same material, At least a part of the metal wire layers 156 and the contact plugs 158 may be formed of a different material.

In some embodiments, a plurality of other multi-layered wire patterns are formed in the wiring interlayer insulating layer 152 at the same level as the multi-layered wire patterns 154.

A plurality of contact pads 160 are formed on the wiring interlayer insulating layer 152 so as to be electrically connected to the multi-layered wire patterns 154. The contact pads 160 may be formed of Al.

A passivation layer 162 is formed on the BEOL structure 150 to expose a portion of each of the contact pads 160. The passivation layer 162 may be a polyimide layer or a silicon nitride layer.

A plurality of bumps 164 are formed so as to be electrically connected to the contact pads 160 exposed via the passivation layer 162.

Each of the bumps 164 has a stacked structure including a first metal layer 164A and a second metal layer 164B, The first metal layer 164A may be formed of Cu, Ni, or an alloy thereof. The second metal layer 164B may be formed of Sn, Ag, Pb, Au, Cu, Bi, and an alloy thereof. For example, the second metal layer 164B may be formed of a Sn—Ag alloy. The first metal layer 164A and the second metal layer 164B may be sequentially formed by performing an electroplating process and a reflow process.

In some embodiments, each bump 164 may further include a second seed layer interposed between the contact pad 160 and the first metal layer 164A, The second seed layer may have a stacked structure formed of Ti/Cu or TiW/Cu. The second seed layer may be used to form the first metal layer 164A by electroplating.

Referring to FIG. 2I, an adhesive coating layer 170 is applied on surfaces of the plurality of bumps 164, and the substrate 102 with the plurality of bumps 164 formed thereon is mounted on a wafer supporting substrate 172 by using the adhesive coating layer 170 as an adhesive material.

The adhesive coating layer 170 may be formed of a polymer adhesive agent that can be decomposed at a high temperature. For example, the adhesive coating layer 170 may include at least one of polynorbornenes and poly(alkyl carbonates). In some embodiments, the adhesive coating layer 170 is applied on the substrate 102 with the plurality of bumps 164 formed thereon by spin coating, spray coating, or lamination. In addition, soft baking or an exposing process may be performed on the substrate 102 on which the adhesive coating layer is applied.

The wafer supporting substrate 172 may be a blank silicon wafer or a glass supporting substrate.

A bottom surface 102B of the substrate 102, which is opposite to a surface of the substrate 102 on which the wafer supporting substrate 172 is provided, may be exposed.

Referring to FIG. 2J, a backlapping or thinning process is performed until the sacrificial patterns 134 are exposed, thereby partially removing the substrate 102 from the bottom surface 102B of the substrate 102. In other words, a portion of the bottom surface 102B may be removed to expose the sacrificial patterns 134.

To expose the sacrificial patterns 134, the substrate 102 is removed to a predetermined thickness from the bottom surface 102B of the substrate 102 by the backlapping process, and the insulating layer 132 covering the sacrificial patterns 134 is partially removed. As a result, a planarized backside surface 102C of the substrate 102 is exposed to the outside around the exposed sacrificial patterns 134.

Referring to FIG. 2K, the exposed sacrificial patterns 134 (refer to FIG. 2J) are removed.

To remove the sacrificial patterns 134, various processes may be performed according to materials constituting the sacrificial patterns 134. For example, the sacrificial patterns 134 may be removed by wet etching, ashing, or stripping.

The exposed sacrificial patterns 134 are removed so that the insulating layers 132 and the first barrier layers 136 are exposed through the via holes 130. In some embodiments, when the sacrificial patterns 136 are removed from the via holes 130, the first barrier layers 136 inside the via holes 130 may also be partially removed so that the first seed layer 140 may be exposed through the via hole 130. In another embodiment, when the sacrificial patterns 136 are removed from the via holes 130, the first barrier layers 136 and the first seed layers 140 inside the via holes 130 may be partially exposed so that the first conductive patterns 142P may be exposed through the via holes 130.

Referring to FIG. 2L, a second barrier layer 176 is formed in the via holes 130 that are opened from the backside 102C of the substrate 102 so as to cover the insulating layers 132 and the first barrier layers 136 that are exposed inside the via holes 130.

The second barrier layer 176 is formed on the backside 102C of the substrate 102 as well as inside the via holes 130.

If the first seed layers 140 are exposed inside the via holes 130 as a result of performing a process illustrated in FIG. 2K, the second barrier layer 176 is directly formed on the insulating layers 132 and the first seed layers 140 inside the via holes 130. Also, if the first conductive patterns 142P are exposed inside the via holes 130, the second barrier layer 176 is directly formed on the first conductive patterns 142P inside the via holes 130.

Referring to FIG. 2M, a second seed layer 180 and a second conductive layer 182 are sequentially formed on the second barrier layer 176 inside the via holes 130.

The second seed layer 180 is formed inside and outside the via holes 130 to cover the second barrier layer 176. The second seed layer 180 may have a stacked structure formed of Ta/Cu or Ti/Cu. The second seed layer 180 may be formed by PVD.

The second conductive layer 182 is formed on the second barrier layer 176 to a thickness sufficient to cover the via holes 130. The second conductive layer 182 may be formed of Cu. For example, a Cu film may be formed as the second conductive layer 182 on a surface of the second seed layer 180 by using an electroplating process. Alternatively, the second conductive layer 182 may be formed of W or Al. In this case, the second seed layer 180 may not be formed. In other words, the second conductive layer 182 may be directly formed on the second barrier layer 176 by PVD.

An aspect ratio of a space to be filled by the second seed layer 180 and the second conductive layer 182 inside the via holes 130 can be significantly smaller than that of whole space of the via holes 130. Therefore, when the second seed layer 180 and the second conductive layer 182 are formed, problems such as delamination thereof may not occur and the inner space of the via holes 130 may be satisfactorily or sufficiently filled by the second seed layer 180 and the second conductive layer 182.

Referring to FIG. 2N, a plurality of first mask patterns 184 are formed on the second conductive layer 182.

Each of the plurality of first mask patterns 184 is formed to correspond to each of the via holes 130 such that the first mask pattern 184 has a second width W2 that is larger than a first width W1 of the via hole 130. In some embodiments, the plurality of first mask patterns 184 may be photoresist patterns.

Referring to FIG. 2O, the second conductive layer 182 is isotropically etched using the first mask patterns 184 as an etching mask to form a plurality of second conductive patterns 182P.

The second seed layer 180 and the second barrier layer 176 that are disposed on the backside 102C of the substrate 102 and between the second conductive patterns 182P are also partially removed to expose a portion of the backside 102C of the substrate 102 around the second conductive patterns 182P.

The isotropic etching process of the second conductive layer 182 may be performed by wet etching. To partially remove the second seed layer 180 and the second barrier layer 176, a wet etching process or a dry etching process may be used. In some embodiments, after the second seed layer 180 and the second barrier layer 176 are partially removed, an undercut shape is formed from exposed sidewalls of the second barrier layer 176 so that the second barrier layer 176 may have a width in a horizontal direction which is smaller than that of the second seed layer 180. The sidewalls of the second barrier layer 176 may be a straight line type or a round type which extends in a vertical direction.

As a result, a plurality of second TSV contact patterns VB1, each of which consists of the second barrier layer 176, the second seed layer 180, and the second conductive pattern 182P, are formed in the via holes 130. Each of the plurality of second TSV contact patterns VB1 contacts the first TSV contact pattern VA inside the via hole 130. That is, a plurality of TSV contact patterns each including the first TSV contact pattern VA and the second TSV contact pattern VB1 are formed.

Each second TSV contact pattern VB1 has a unitary shape extending integrally from the inside to the outside of the via hole 130 in the vicinity of an end of the via hole 130 which is adjacent to the backside 102C of the substrate 102. The plurality of second TSV contact patterns VB1 each include an internal plug part VB11 that is positioned in the via hole 130 and has a third width W3 and an external pad part VB12 that has a fourth width W4 that is larger than the third width W3, extends on the backside 102C of the substrate 102, and protrudes in an external direction of the substrate 102 or otherwise extends from within the via hole 130 onto the surface 102C of the substrate 102.

Sidewalls of the external pad part VB12 taper in a direction away from the backside 102C of the substrate 102.

Referring to FIG. 2P, the plurality of first mask patterns 184 (refer to FIG. 2O) are removed to expose a top surface of the external pad part VB12, which is an external-side end of each of the second TSV contact patterns VB1, and a pad protective layer 186 is formed to cover an exposed surface of the second conductive pattern 182P of the external pad part VB12. The pad protective layer 186 may prevent the exposed surface of the second conductive pattern 182P from being oxidized.

The pad protective layer 186 may be formed of an insulating material. Also, the pad protective layer 186 may be an organic material layer.

In some embodiments, the pad protective layer 186 may be an organic material layer obtained by surface-treating the exposed surface of the second conductive pattern 182P by using an organic solderability preservative (OSP) method. In another embodiment, the pad protective layer 186 may include a metal constituting the second conductive pattern 182P, for example, a material having a high electron affinity with a Cu surface, and may by formed such that a monolayer formed of a monomer or a multilayer having a repeatedly stacked structure of the single layers is formed only on a surface of the second conductive pattern 182P by using the high electron affinity of the material. The pad protective layer 186 may be formed by pre-flux coating.

The pad protective layer 186 may consist of an azole compound or an azole compound including Cu. For example, the pad protective layer 186 may consist of at least one compound selected from benzotriazoles, pyrroles, imidazoles, pyrazoles, triazoles, indoles, benzimidazoles, indazoles, and purines.

The pad protective layer 186 may have a thickness ranging from about 0.01 to about 1.0 μm.

The pad protective layer 186 may also consist of a conductive material. For example, the pad protective layer 186 may consist of Ni, Pd, Au, Sn, Ag, Pb, Bi, or a combination thereof.

If desired, the adhesive coating layer 170 and the wafer supporting substrate 172 may be removed to expose the plurality of bumps 164.

Figure 3A:
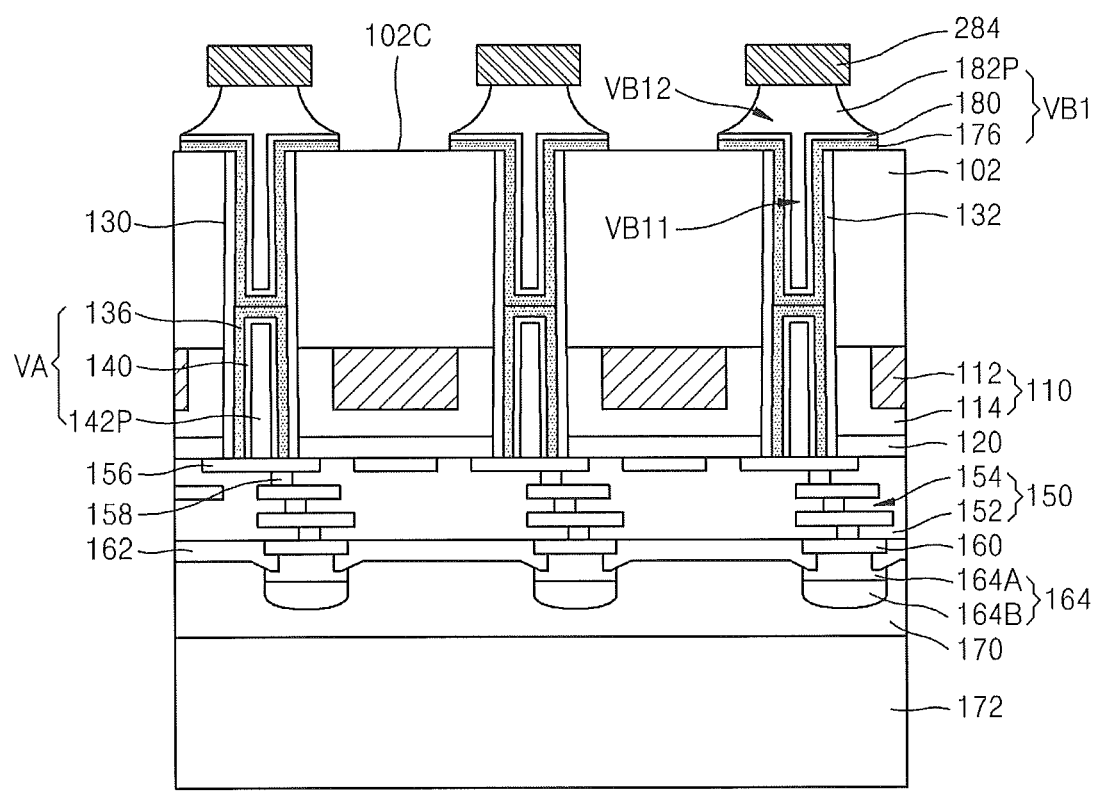
FIGS. 3A and 3B are cross-sectional views illustrating a method of manufacturing an integrated circuit device according to embodiments of the inventive concept.
Figure 3B:
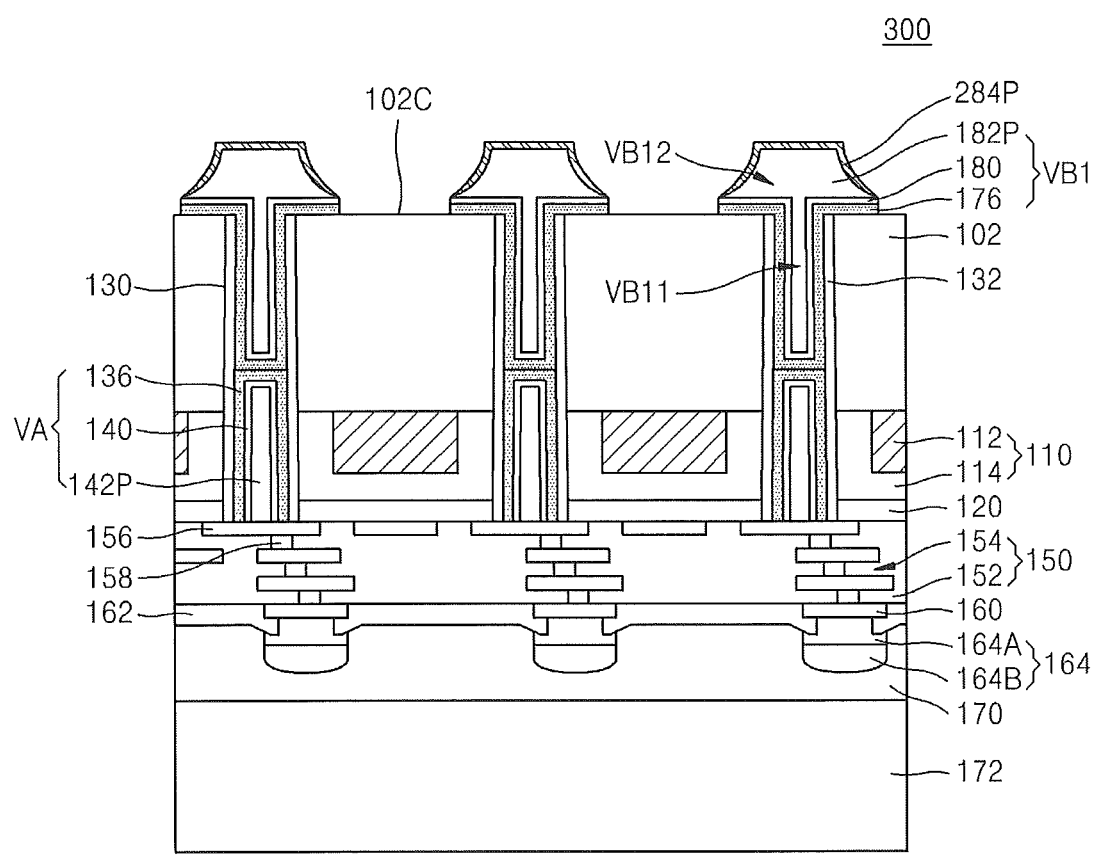

FIGS. 3A and 3B are cross-sectional views illustrating a method of manufacturing an integrated circuit device 300 (refer to FIG. 3B) according to embodiments of the inventive concept. In FIGS. 3A and 3B, like reference numerals denote like elements as in FIGS. 2A through 2P, and a detailed description thereof will not be repeated herein to avoid redundancy.

Referring to FIG. 3A, a plurality of second TSV contact patterns VB1 extending from the inside to the outside of the via holes 130 formed on the substrate 102 are formed using the processes described above with reference to FIGS. 2A through 2O.

In the present embodiment, however, a plurality of first mask patterns 284 including a conductive material are formed instead of the plurality of first mask patterns 184. The plurality of first mask patterns 284 may consist of Sn, Ag, Pb, Au, Cu, Bi, or an alloy thereof For example, the first mask patterns 284 may consist of a Sn—Ag alloy. The first mask patterns 284 may be formed by electroplating, CVD, or PVD.

Referring to FIG. 3B, in a state where the plurality of first mask patterns 284 remain on the plurality of second TSV contact patterns VB1, the plurality of first mask patterns 284 are subjected to a reflow process so as to form a plurality of pad protective layers 284P including the first mask patterns 284 subjected to the reflow process, each of which covers an exposed surface of the external pad part VB12 of each of the second TSV contact patterns VB1. In some embodiments, the pad protective layer 284P may cover the second barrier layer 176 and the second seed layer 180 that are disposed below the external pad part VB12, in addition to the exposed surface of the external pad part VB12.

The reflow process of the first mask patterns 284 may be performed at a temperature ranging from about 200 to about 300° C.

Since the exposed surface of the external pad part VB12 is covered by the pad protective layer 284P, oxidation of the plurality of external pad parts VB12 may be reduced and/or prevented.

FIGS. 4A through 4F are cross-sectional views illustrating a method of manufacturing an integrated circuit device 400 (refer to FIG. 4F) according to embodiments of the inventive concept. In FIGS. 4A through 4F, like reference numerals denote like elements as in FIGS. 1 through 3B, and a detailed description thereof will not be repeated herein to avoid redundancy.

Figure 4A:
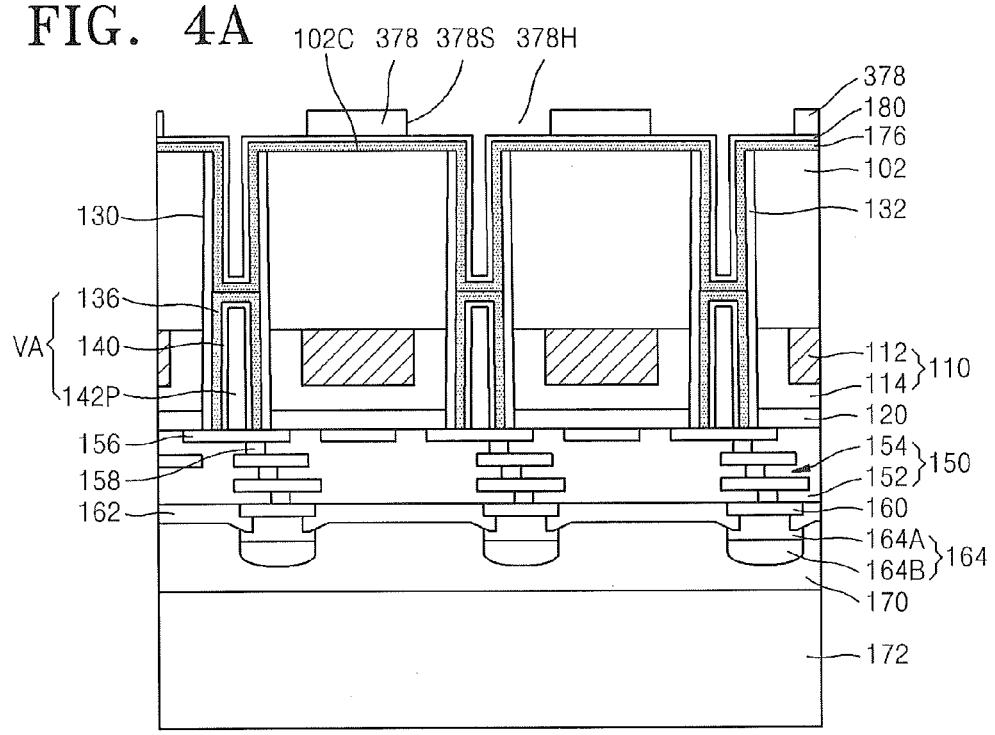
FIGS. 4A through 4F are cross-sectional views illustrating a method of manufacturing an integrated circuit device according to embodiments of the inventive concept.

Referring to FIG. 4A, a second barrier layer 176 is formed in a plurality of via holes 130 that are opened from a backside 102C of a substrate 102 and on the backside 102C of the substrate 102 by using the processes described above with reference to FIGS. 2A through 2I. A second seed layer 180 is formed on the second barrier layer 176 by using the method described above with reference to FIG. 2M.

Then, a mask pattern 378 for separation which covers the second seed layer 180 is formed on the backside 102C of the substrate 102. The mask pattern 378 has a plurality of openings 378H that expose the plurality of via holes 130. The width of the openings 378H is defined by inner walls 378S of the openings 378H.

The mask pattern 378 is formed to cover the backside 102C of the substrate 102 in a region between two adjacent via holes 130 of the plurality of via holes 130. The mask pattern 378 may be a photoresist pattern.

Figure 4B:
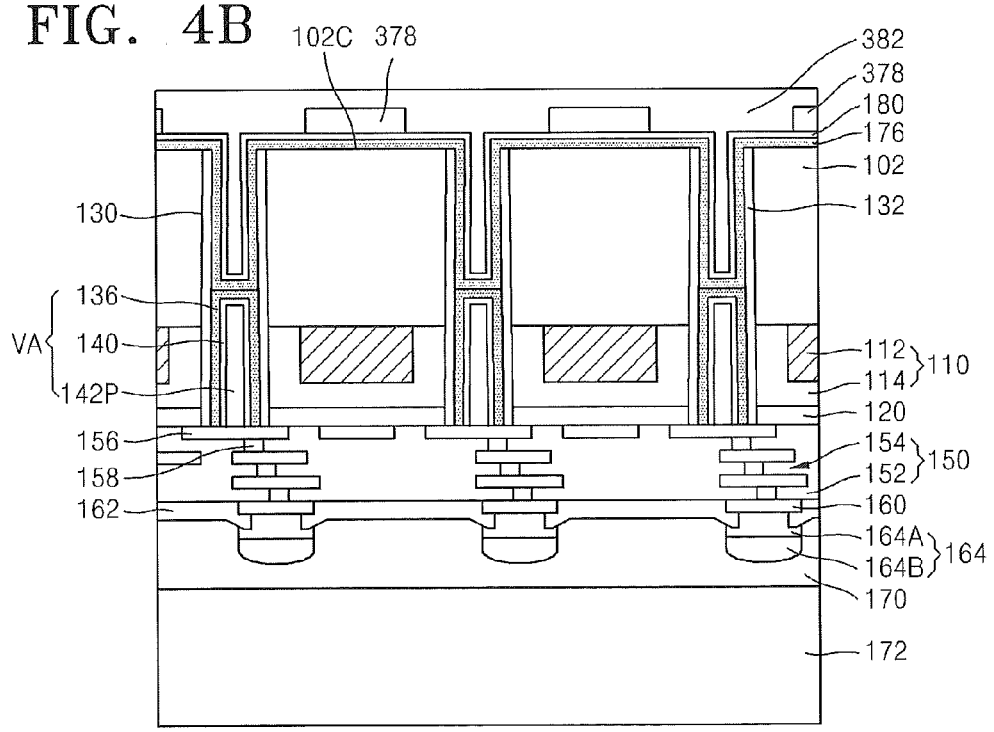

Referring to FIG. 4B, a second conductive layer 382 is formed on the second seed layer 180 inside and outside the via holes 130 by using a method that is similar to the method of forming the second conductive layer 182 described above with reference to FIG. 2M.

In some embodiments, the second conductive layer 382 may be formed on the second seed layer 180 to a thickness sufficient to fill the inside of the via holes 130 and the openings 378H formed in the mask pattern 378 and cover a top surface of the mask pattern 378.

The second conductive layer 382 may be formed of Cu. For example, a Cu film may be formed as the second conductive layer 382 on a surface of the second seed layer 180 by using an electroplating process. Alternatively, the second conductive layer 382 may be formed of W or Al. In this case, the second seed layer 180 may not be formed. In other words, the second conductive layer 382 may be directly formed on the second barrier layer 176 by PVD.

Figure 4C:
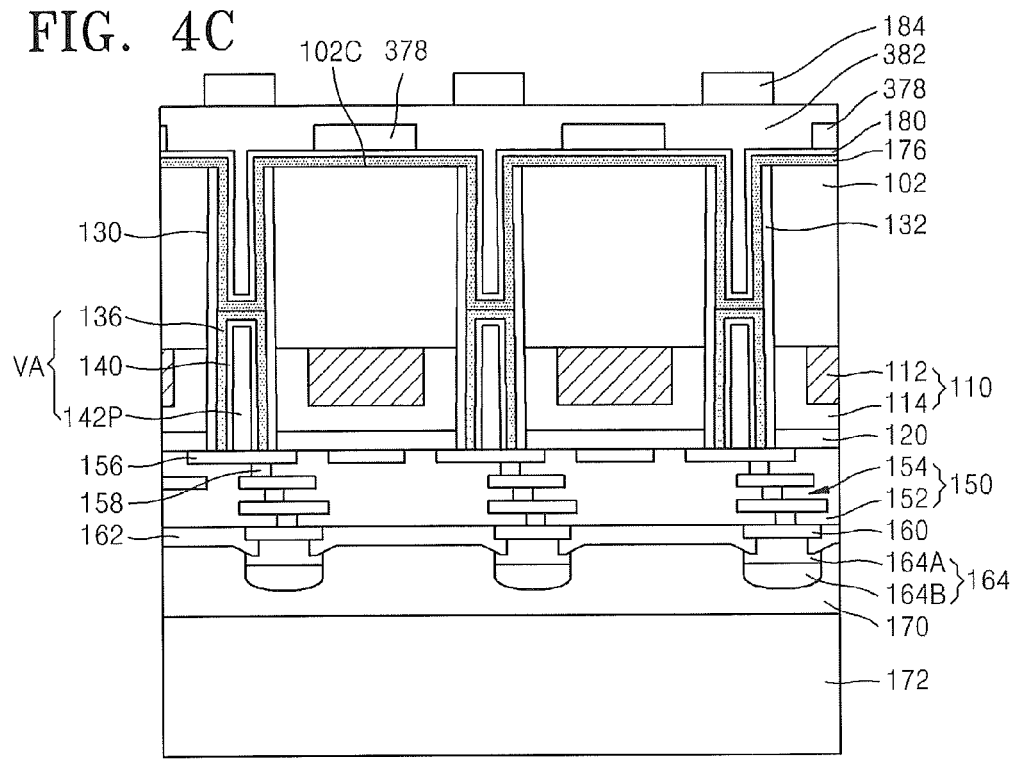

Referring to FIG. 4C, a plurality of first mask patterns 184 are formed on the second conductive layer 382 by using the method described above with reference to FIG. 2N.

Each of the first mask patterns 184 is formed to correspond to a position where the via hole 130 is formed, at a position where the first mask patterns 184 respectively overlap vertically with the openings 378H formed in the mask pattern 378 for separation.

Figure 4D:
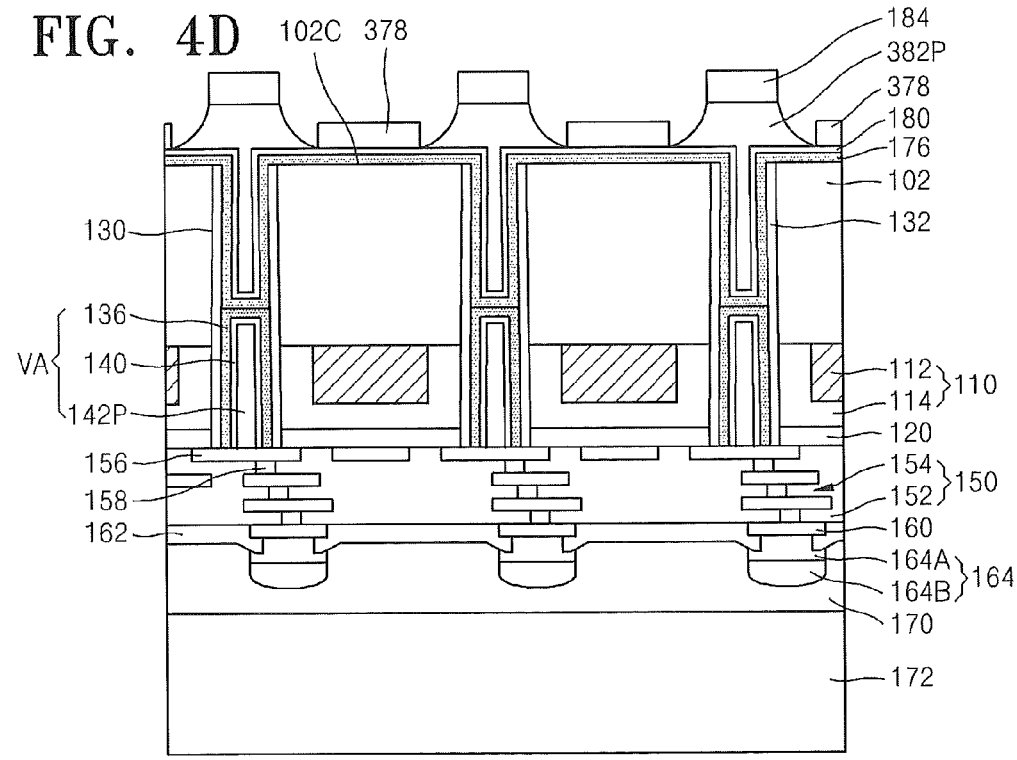

Referring to FIG. 4D, the second conductive layer 382 is isotropically etched using the first mask patterns 184 as an etching mask by using a method that is similar to the method described above with reference to FIG. 2O so as to form a plurality of second conductive patterns 382P. The second conductive layer 382 may be isotropically etched using the mask pattern 378 as an etch stop layer in the isotropic etching process of the second conductive layer 382 until at least a portion of the mask pattern 378 is exposed.

By using the mask pattern 378, a likelihood of the second conductive layer 382 not being separated and remaining in an integrated form between two adjacent via holes 130 may be reduced and/or prevented, even if the second conductive layer 382 is not etched to a sufficient depth during the isotropic etching process of the second conductive layer 382. In other words, the mask pattern 378 may prevent electrical contact between adjacent TSVs even when the second conductive layer 382 is not completely or sufficiently etched.

Figure 4E:
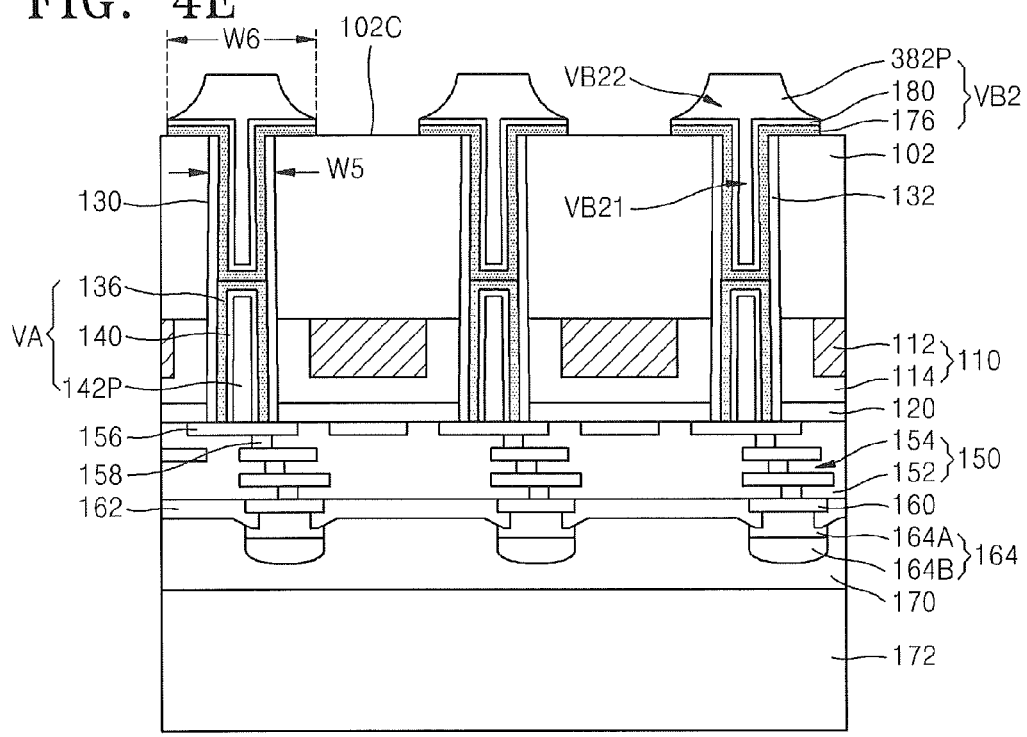

Referring to FIG. 4E, the mask pattern 378 is removed from a resultant structure of FIG. 4D. In this regard, if the first mask patterns 184 and the mask pattern 378 are formed of the same material, the first mask patterns 184 and the mask pattern 378 are simultaneously removed.

On the other hand, if the first mask patterns 184 and the mask pattern 378 are formed of a different material, at least a portion of the first mask patterns 184 may remain without being completely removed while the mask pattern 378 is removed. In this case, a separate process may be performed to remove the first mask patterns 184.

After the mask pattern 378 is removed, the second seed layer 180 and the second barrier layer 176 that are disposed on the backside 102C of the substrate 102 and between the second conductive patterns 382P are partially removed so as to expose a portion of the backside 102C of the substrate 102 around the plurality of first mask patterns 184.

As a result, a plurality of second TSV contact patterns VB2 each including the second barrier layer 176, the second seed layer 180, and the second conductive pattern 382P are formed in the plurality of via holes 130. Each second TSV contact pattern VB2 contacts each of a plurality of first TSV contact patterns VA in the via hole 130. That is, a plurality of TSV contact patterns including the first TSV contact patterns VA and the second TSV contact patterns VB2 are formed.

Each second TSV contact pattern VB2 has a shape extending integrally to the outside of the via hole 130 from the inside of the via hole 130 in the vicinity of an end of the via hole 130 which is adjacent to the backside 102C of the substrate 102. The plurality of second TSV contact patterns VB2 each include an internal plug part VB21 that is positioned in the via hole 130 and has a fifth width W5 and an external pad part VB22 that has a sixth width W6 that is larger than the fifth width W5, extends on the backside 102C of the substrate 102, and protrudes in an external direction of the substrate 102.

The external pad part VB22 tapers in a direction away from the backside 102C of the substrate 102.

Figure 4F:
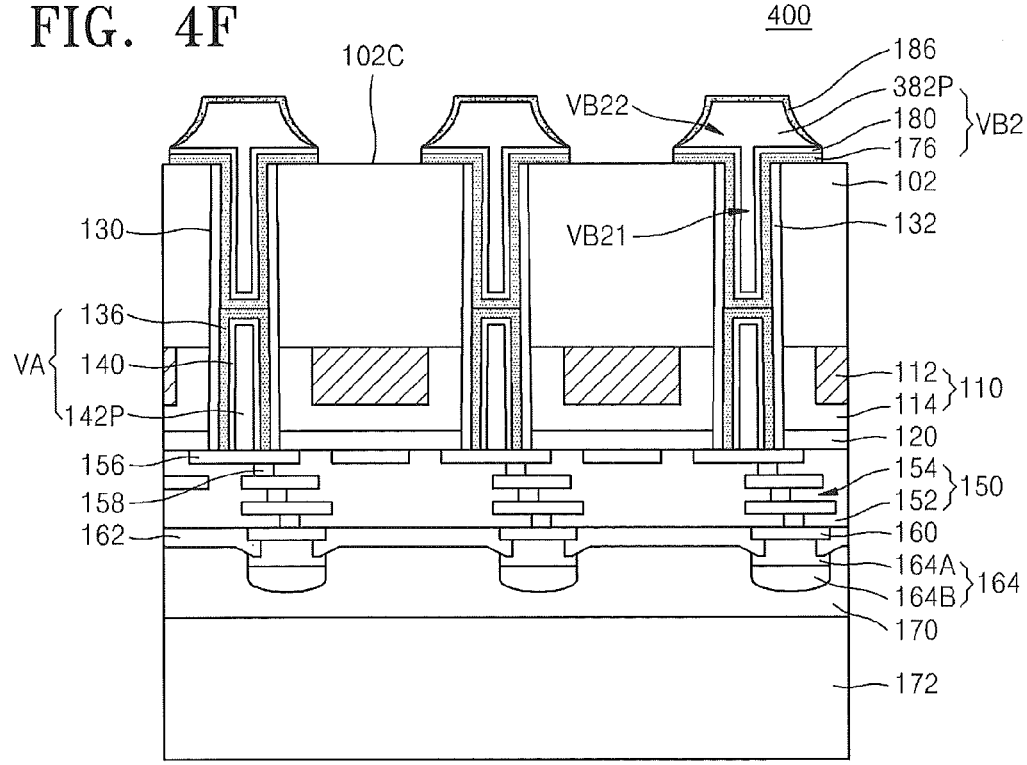

Referring to FIG. 4F, a pad protective layer 186 is formed to cover an exposed surface of the second conductive pattern 382P of the external pad part VB22 by using the method described above with reference to FIG. 2P.

Figure 5C:
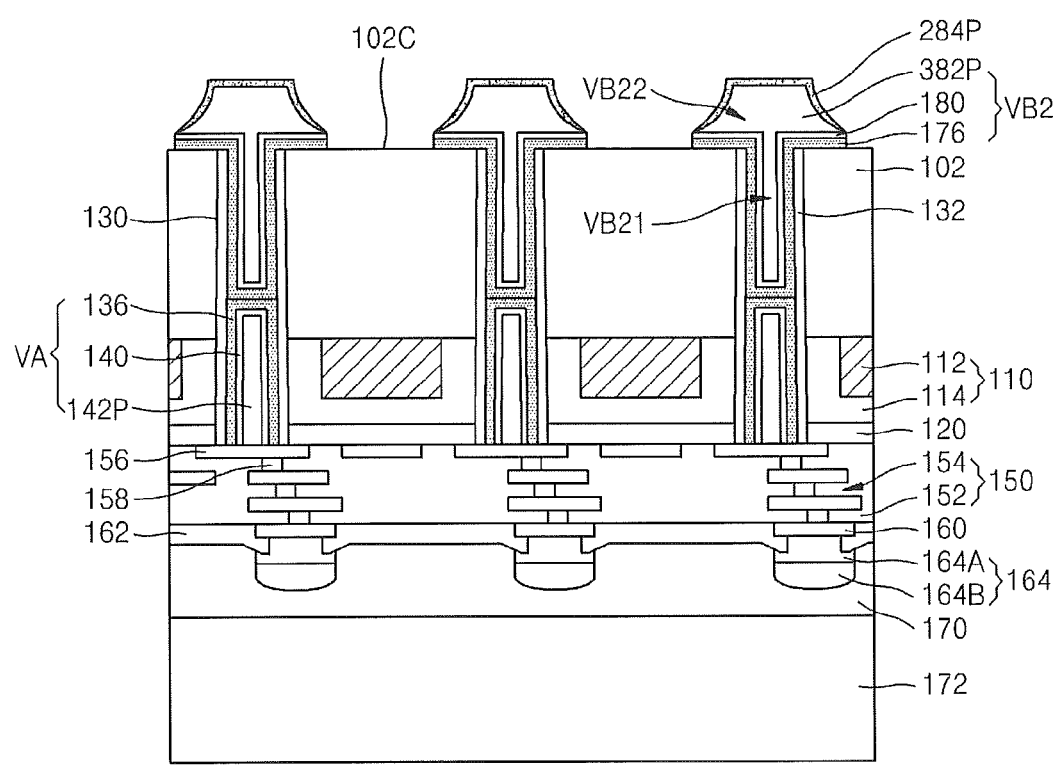

FIGS. 5A through 5C are cross-sectional views illustrating a method of manufacturing an integrated circuit device 500 (refer to FIG. 5C) according to embodiments of the inventive concept. In FIGS. 5A through 5C, like reference numerals denote like elements as in FIGS. 1 through 4F, and a detailed description thereof will not be repeated herein to avoid redundancy.

Referring to FIG. 5A, a plurality of second conductive patterns 382P each extending from the inside to the outside of the via hole 130 formed in the substrate 102 are formed by using the processes described above with reference to FIGS. 4A through 4D.

In the present embodiment, however, a plurality of first mask patterns 284 formed of the conductive material as described above with reference to FIG. 3A are formed instead of the plurality of first mask patterns 184.

Referring to FIG. 5B, a mask pattern 378 for separation is removed from the resultant structure of FIG. 5A by using a method that is similar to the method described above with reference to FIG. 4E. The first mask patterns 284 and the mask pattern 378 are formed of a different material. Therefore, while the mask pattern 378 is removed, the first mask patterns 284 remain without being removed.

After the mask pattern 378 is removed, the second seed layer 180 and the second barrier layer 176 that are disposed on the backside 102C of the substrate 102 and between the second conductive patterns 382P are partially removed so as to expose a portion of the backside 102C of the substrate 102 around the plurality of first mask patterns 284.

As a result, a plurality of second TSV contact patterns VB2 each including the second barrier layer 176, the second seed layer 180, and the second conductive pattern 382P are formed in the plurality of via holes 130. Each second TSV contact pattern VB2 contacts each of a plurality of first TSV contact patterns VA in the via hole 130.

Each second TSV contact pattern VB2 has a shape extending integrally to the outside of the via hole 130 from the inside of the via hole 130 in the vicinity of an end of the via hole 130 which is adjacent to the backside 102C of the substrate 102. The plurality of second TSV contact patterns VB2 each include an internal plug part VB21 that is positioned in the via hole 130 and an external pad part VB22 that extends on the backside 102C of the substrate 102 and protrudes from the surface 102C of the substrate 102 in an external direction. The sidewalls of the external pad part VB22 taper in a direction away from the backside 102C of the substrate 102.

Referring to FIG. 5C, in a state where the plurality of first mask patterns 284 (refer to FIG. 5B) remain on the plurality of second TSV contact patterns VB2, the plurality of first mask patterns 284 are subjected to a reflow process by using the method described above with reference to FIG. 3B so as to form a plurality of pad protective layers 284P including the first mask patterns 284 subjected to the reflow process, each of which covers an exposed surface of the external pad part VB12 of each of the second TSV contact patterns VB2.

Since the exposed surface of the external pad part VB22 is covered by the pad protective layer 284P, oxidation of the plurality of external pad parts VB22 may be reduced and/or prevented.

FIGS. 6A through 6J are cross-sectional views illustrating a method of manufacturing an integrated circuit device 600 (refer to FIG. 6J) according to embodiments of the inventive concept. In FIGS. 6A through 6J, like reference numerals denote like elements as in FIGS. 1 through 5C, and a detailed description thereof will not be repeated herein to avoid redundancy.

Figure 6A:
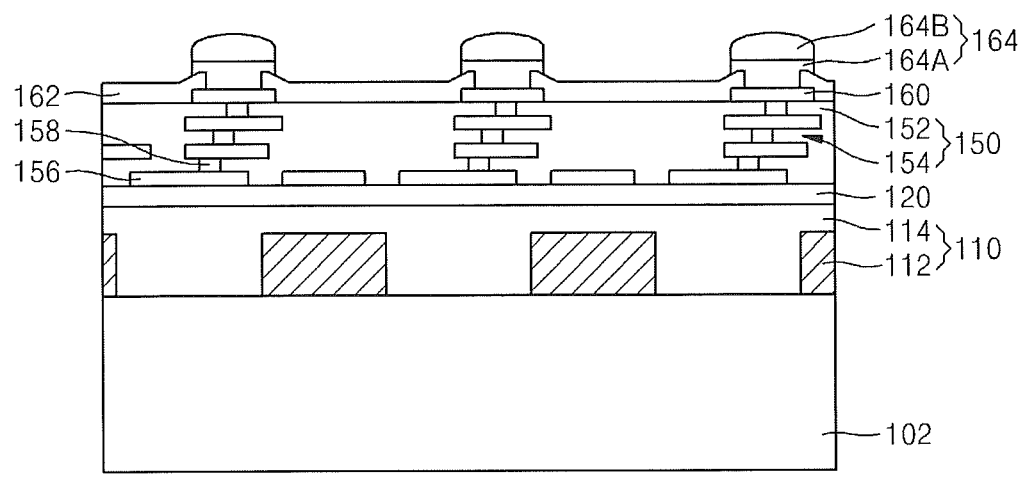

Referring to FIG. 6A, an FEOL structure 110 including a plurality of integrated circuit units 112 and an interlayer insulating layer 114 is formed on a substrate 102, an etch stop layer 120 is formed on the FEOL structure 110, and a BEOL structure 150 is formed on the etch stop layer 120. The BEOL structure 150 includes a wiring interlayer insulating layer 152 and a plurality of multi-layered wire patterns 154. Each of the multi-layered wire patterns 154 includes a plurality of metal wire layers 156 and a plurality of contact plugs 158.

A plurality of contact pads 160 are formed on the wiring interlayer insulating layer 152, and a passivation layer 162 and a plurality of bumps 164 are sequentially formed on the BEOL structure 150. Each of the bumps 164 has a stacked structure including a first metal layer 164A and a second metal layer 164B.

Figure 6B:
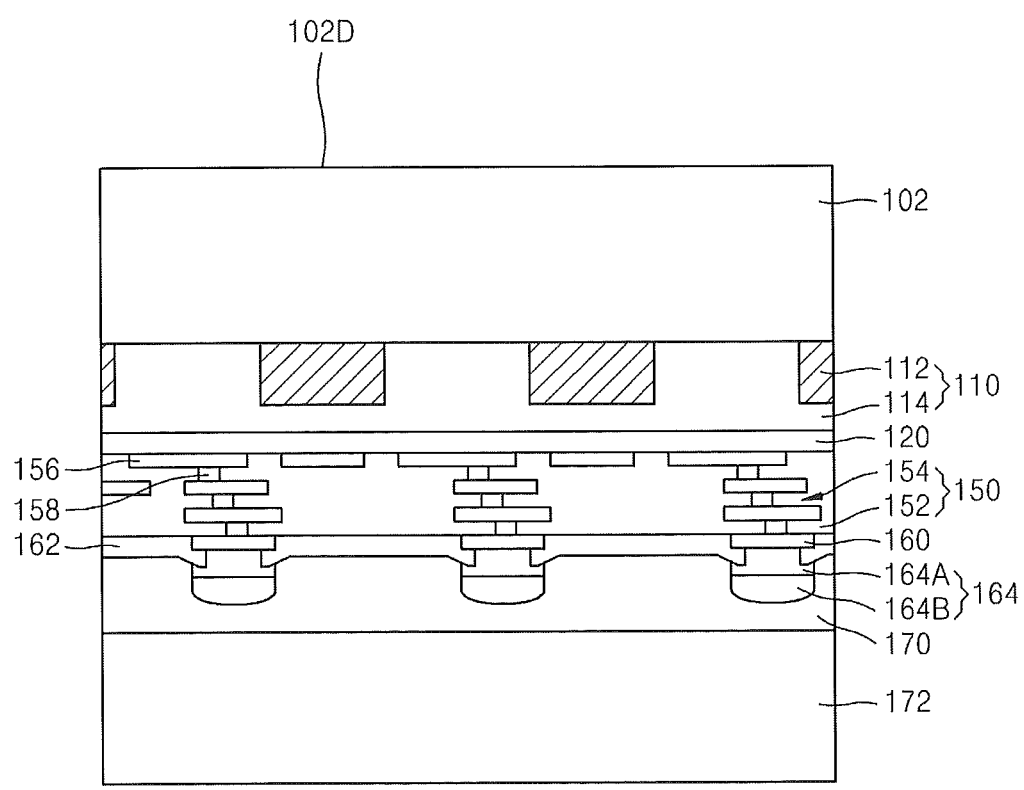

Referring to FIG. 6B, an adhesive coating layer 170 is applied on surfaces of the plurality of bumps 164, and the substrate 102 with the plurality of bumps 164 formed thereon is mounted on a wafer supporting substrate 172 by using the adhesive coating layer 170 as an adhesive material.

A backside 102D of the substrate 102, which is opposite to a surface of the substrate 102 on which the wafer supporting substrate 172 is provided, may be exposed. The backside 102D of the substrate 102 may be a surface corresponding to the bottom surface 102B of the substrate 102 illustrated in FIG. 21. Alternatively, the backside 102D of the substrate 102 may be a surface obtained as a result of performing a back-lapping or thinning process on the bottom surface 102B of the substrate 102 illustrated in FIG. 21, for example, a surface corresponding to the backside 102C illustrated in FIG. 2J.

Referring to FIG. 6C, a hard mask layer 620 is formed on the backside 102D of the substrate 102, and a mask pattern 622 is formed on the hard mask layer 620. The mask pattern 622 has at least one hole 622H that exposes a portion of a top surface of the hard mask layer 620.

The hard mask layer 620 may be a silicon nitride layer. The hard mask layer 620 may have a thickness ranging from about 200 to about 1,000 Å.

The mask pattern 622 may be formed of a photoresist material.

Referring to FIG. 6D, the hard mask layer 620 is etched using the mask pattern 622 (refer to FIG. 6C) as an etching mask so as to form a plurality of hard mask patterns 620P, and the substrate 102 is etched using the etched mask patterns 622 and the hard mask patterns 620P as etching masks so as to form a plurality of via holes 630 that expose metal wire layers 156. Each via hole 630 penetrates or extends through the substrate 102 and the interlayer insulating layer 114 of the FEOL structure 110.

The via holes 630 may be formed using an anisotropic etching process or by laser drilling. In some embodiments, when the interlayer insulating layer 114 is etched to form the via holes 630, an etch stop point may be determined using the etch stop layer 120. The width and depth of the via holes 630 are not limited to the examples illustrated in the accompanying drawings, and, if desired, via holes 630 having various sizes may be formed.

After the plurality of via holes 630 are formed, the mask pattern 622 (refer to FIG. 6C) is removed to expose a top surface of the hard mask patterns 620P.

Figure 6E:
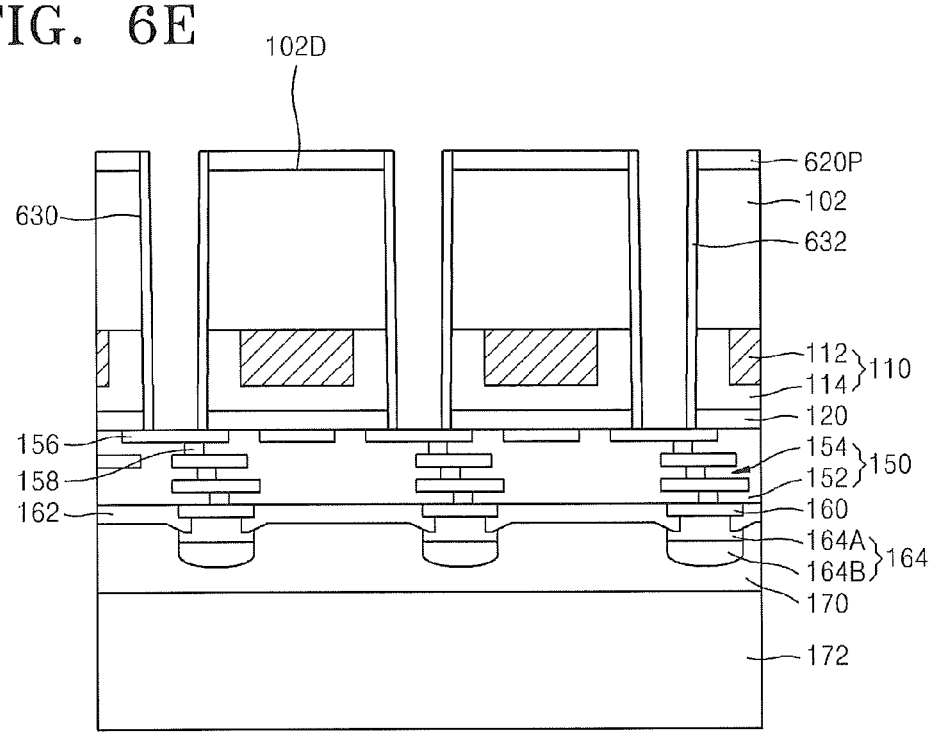

Referring to FIG. 6E, a plurality of insulating patterns 632, each of which cover inner sidewalls of each of the via holes 630, are formed.

In some embodiments, to form the plurality of insulating patterns 632, an insulating layer that covers the inner walls of the via holes 630 and the backside 102D of the substrate 102 may be formed by CVD. And, to expose the plurality of metal wire layers 156 inside the via holes 630, portions of the insulating layer which covers the metal wire layers 156 inside the via holes 630 may be removed by anisotropic ion etching.

The insulating patterns 632 may be a silicon oxide layer.

Figure 6F:
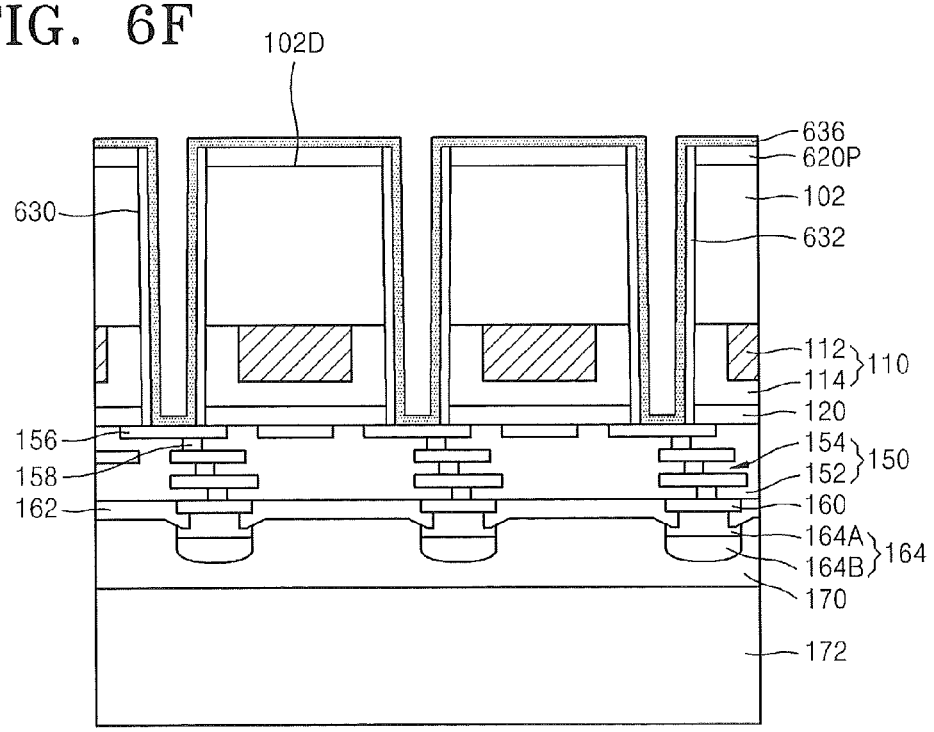

Referring to FIG. 6F, a barrier layer 636 is formed in the via holes 630.

The barrier layer 636 covers exposed surfaces of the metal wire layers 156 and the insulating patterns 632 inside the via holes 630. In the present embodiment, the barrier layer 636 is formed on the insulating patterns 632, extending to the outside of the via holes 630, but is not limited thereto. For example, the barrier layer 636 may be formed only inside the via holes 630.

A detailed description of the barrier layer 636 has already been provided above in the description of the first barrier layer 136 illustrated in FIG. 2E.

Figure 6G:
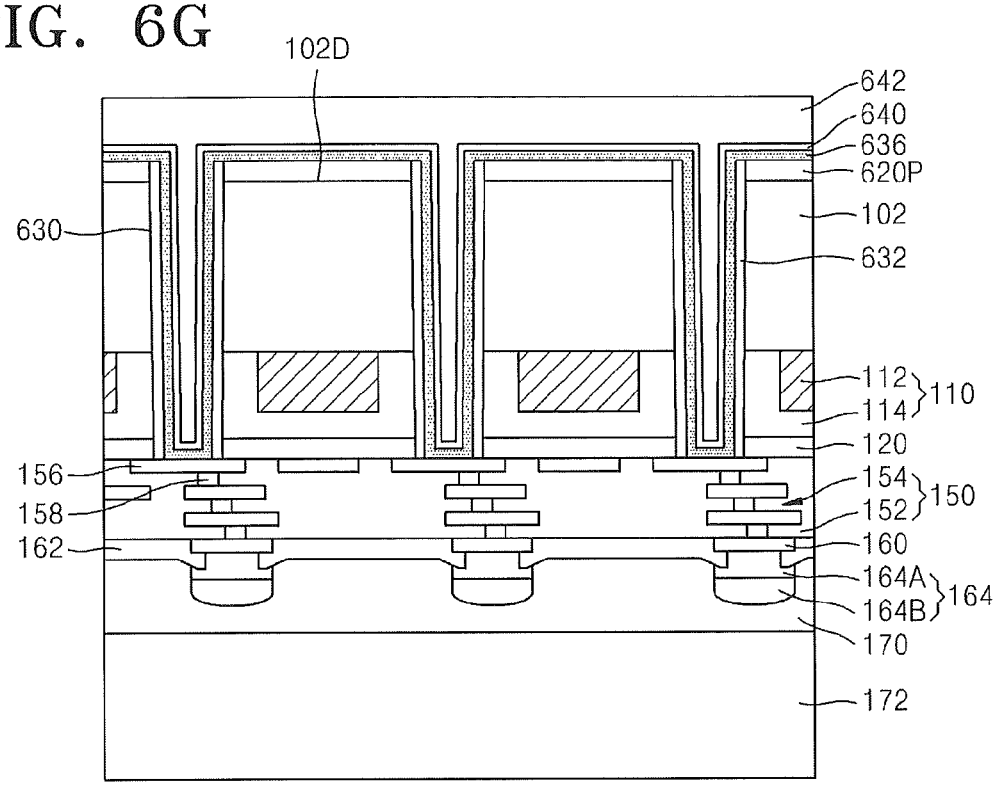

Referring to FIG. 6G, a seed layer 640 and a conductive layer 642 are formed on the barrier layer 636 inside the via hole 630.

A detailed description of the seed layer 640 and the conductive layer 642 has already been provided above in the description of the first seed layer 140 and the first conductive layer 142 illustrated in FIG. 2F.

Figure 6H:
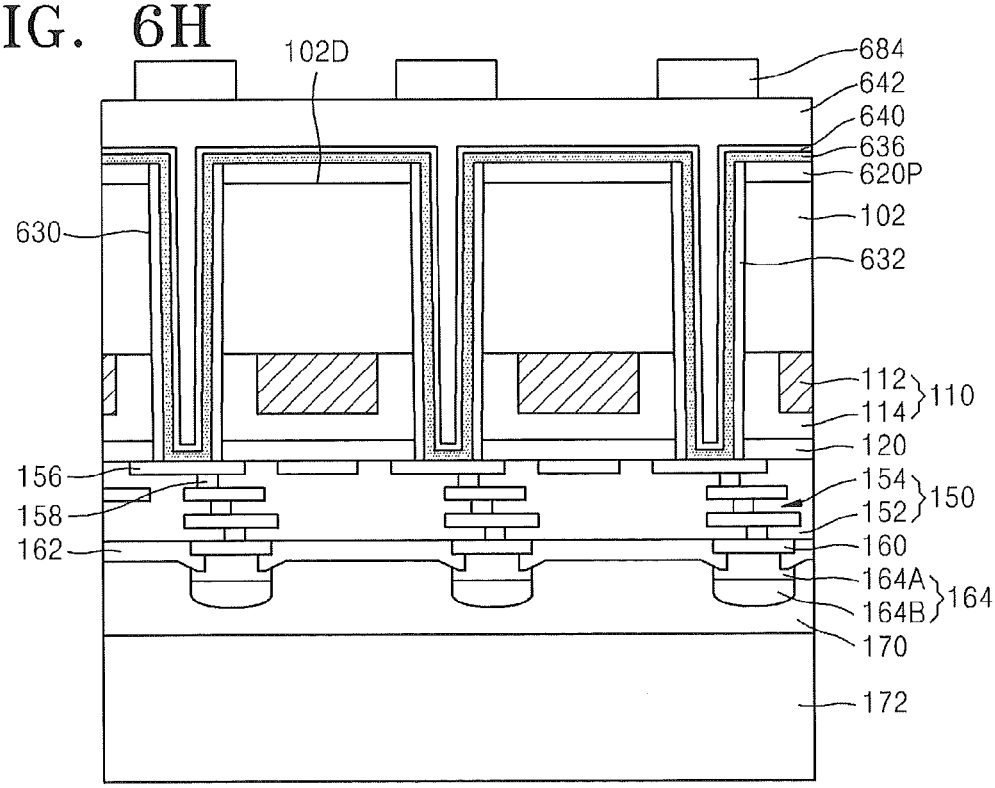

Referring to FIG. 6H, a plurality of mask patterns 684 are formed on the conductive layer 642 by using the method described above with reference to FIG. 2N.

A detailed description of the plurality of mask patterns 684 has already been provided above in the description of the plurality of first mask patterns 184 illustrated in FIG. 2N.

Figure 6I:
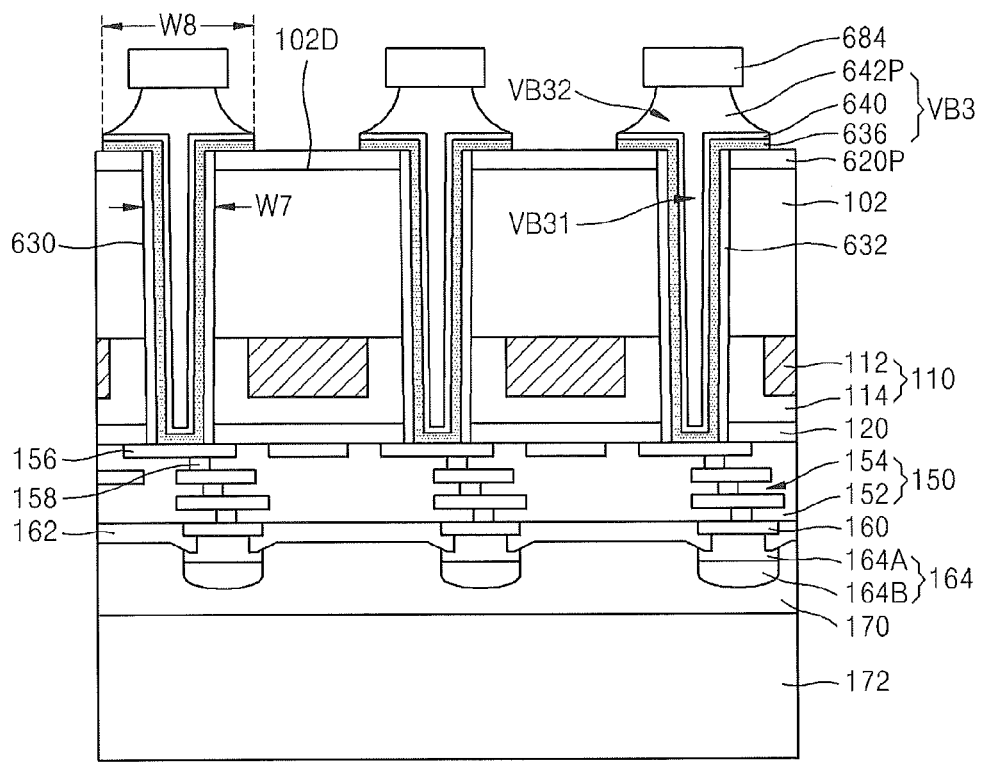

Referring to FIG. 6I, the conductive layer 642 is isotropically etched using the plurality of mask patterns 684 as an etching mask so as to form a plurality of conductive patterns 642P.

Then, the seed layer 640 and the barrier layer 636 that are disposed on the backside 102D of the substrate 102 and between the conductive patterns 642P are partially removed to expose a portion of the backside 102D of the substrate 102 around the plurality of mask patterns 684.

In some embodiments, the isotropic etching process of the conductive layer 642 may be performed by wet etching. The seed layer 640 and the barrier layer 636 may be partially removed by wet etching or dry etching.

As a result, in the via holes 630, a plurality of TSV contact patterns VB3 including the barrier layer 636, the seed layer 640, and the conductive patterns 642P are formed. Each of the TSV contact patterns VB3 contacts the metal wire layers 156 of the BEOL structure 150.

The plurality of TSV contact patterns VB3 have a shape that penetrates the substrate 102 and the FEOL structure 110 and integrally extends from the inside to the outside of the via holes 630. The plurality of TSV contact patterns VB3 each include an internal plug part VB31 that penetrates the substrate 102 and the FEOL structure 110 in the via hole 130 and has a seventh width W7 and an external pad part VB32 that has an eighth width W8 that is larger than the seventh width W7, extends on the backside 102D of the substrate 102, and protrudes in an external direction of the substrate 102.

The external pad parts VB32 taper away from the backside 102D of the substrate 102.

Figure 6J:
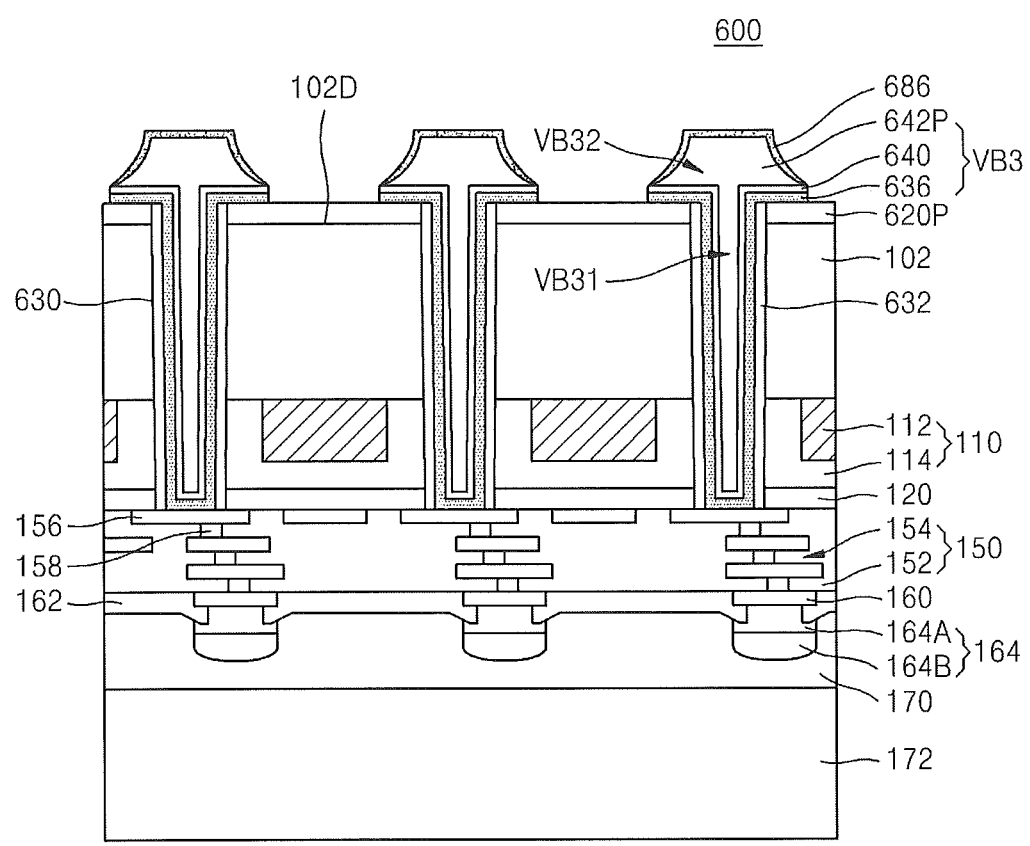

Referring to FIG. 6J, a plurality of mask patterns 684 (refer to FIG. 6I) are removed to expose a top surface of the external pad part VB32, which is an external-side end of each of the TSV contact patterns VB3, and a pad protective layer 686 is formed to cover an exposed surface of the conductive pattern 642P of the external pad part VB32. The pad protective layer 686 may prevent the exposed surface of the conductive pattern 642P from being oxidized.

A detailed description of the pad protective layer 686 has already been provided above in the description of the pad protective layer 186 illustrated in FIG. 2P.

If desired, the adhesive coating layer 170 and the wafer supporting substrate 172 may be removed to expose the plurality of bumps 164.

In some embodiments, the integrated circuit device 600 illustrated in FIG. 6J may be formed using the processes described above with reference to FIGS. 4A through 4F by using the mask pattern 378 for separation (refer to FIG. 4A).

Figure 7A:
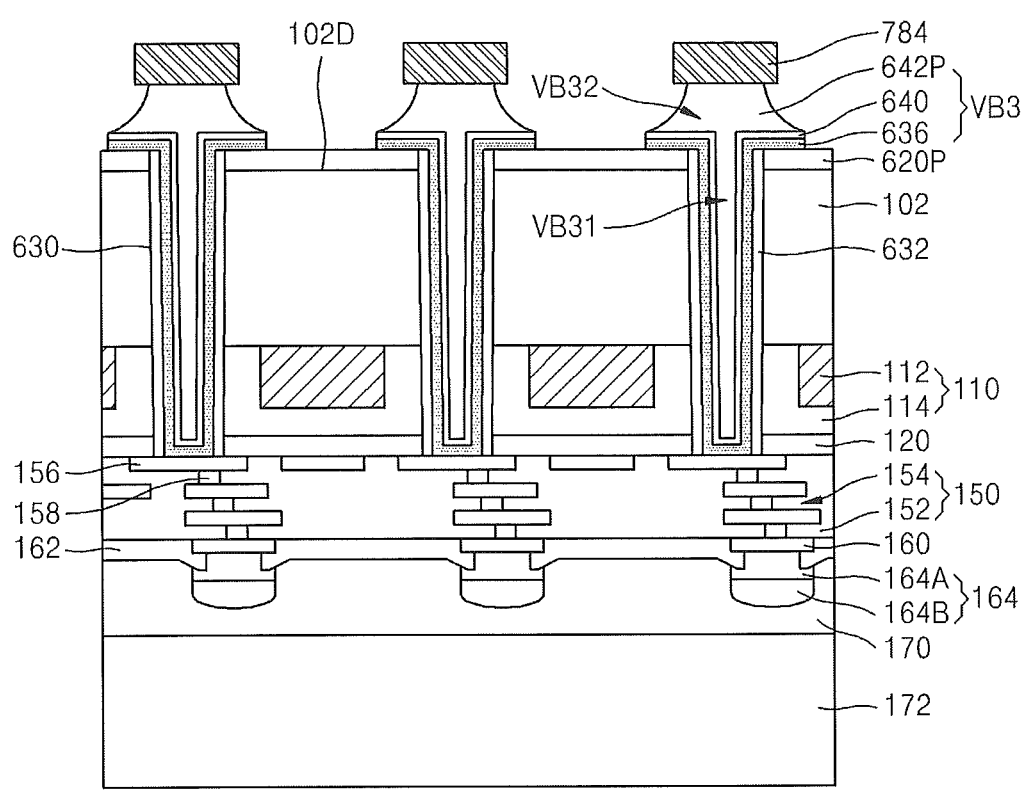
FIGS. 7A and 7B are cross-sectional views illustrating a method of manufacturing an integrated circuit device according to embodiments of the inventive concept.
Figure 7B:
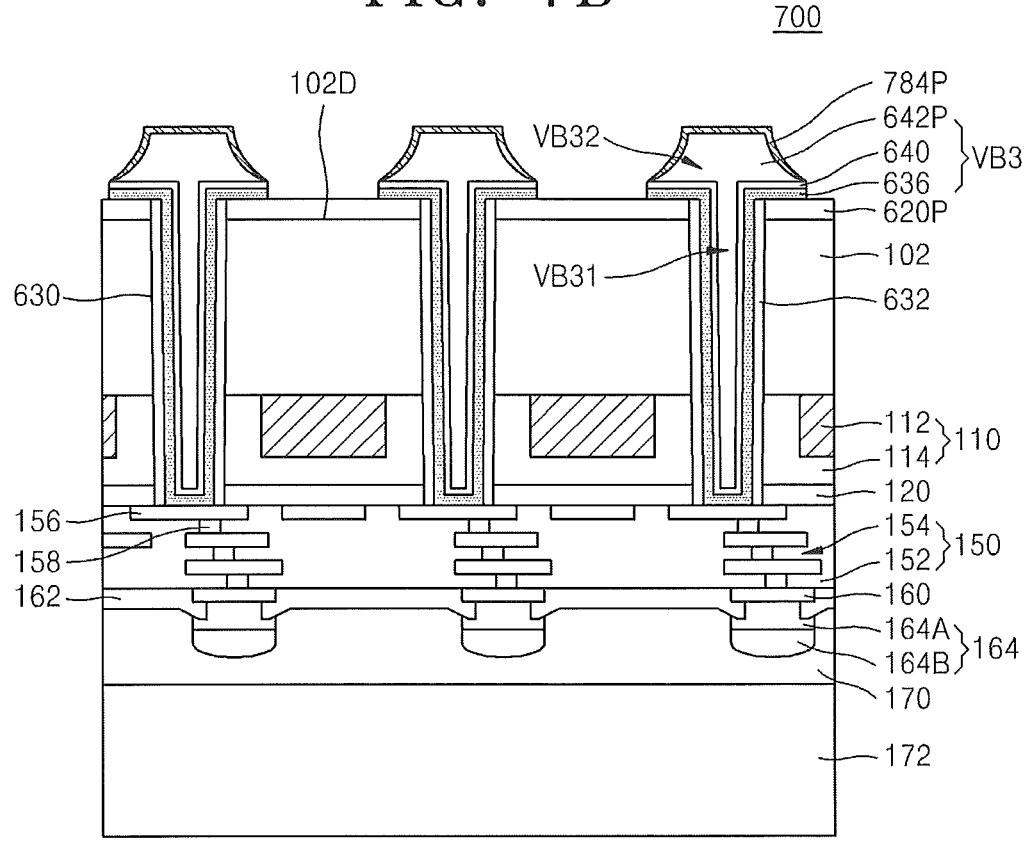

FIGS. 7A and 7B are cross-sectional views illustrating a method of manufacturing an integrated circuit device 700 (refer to FIG. 7B) according to embodiments of the inventive concept. In FIGS. 7A and 7B, like reference numerals denote like elements as in FIGS. 1 through 6J, and a detailed description thereof will not be repeated herein to avoid redundancy.

Referring to FIG. 7A, a plurality of TSV contact patterns VB3 that extend from the inside to the outside of the via hole 630 formed in the substrate 102 are formed using the processes described above with reference to FIGS. 6A through 6I.

In this embodiment, however, a plurality of mask patterns 784 including a conductive material are formed instead of the plurality of mask patterns 684. A detailed description of the plurality of mask patterns 784 has already been provided above in the description of the first mask patterns 284 illustrated in FIG. 3A.

Referring to FIG. 7B, in a state where the plurality of mask patterns 784 remain on the plurality of TSV contact patterns VB3, the plurality of mask patterns 784 are subjected to a reflow process so as to form a plurality of pad protective layers 784P including the mask patterns 784 subjected to the reflow process, each of which covers an exposed surface of the external pad part VB32 of each of the TSV contact patterns VB3.

The reflow process of the mask patterns 784 may be performed at a temperature ranging from about 200 to about 300° C.

Since the exposed surfaces of the external pad parts VB32 are covered by the pad protective layers 784P, oxidation of the plurality of external pad parts VB32 may be reduced and/or prevented.

In some embodiments, the integrated circuit device 700 illustrated in FIG. 7B may be formed using the processes described above with reference to FIGS. 5A through 5C by using the mask pattern 378 for separation (refer to FIG. 5A).

Figure 8:
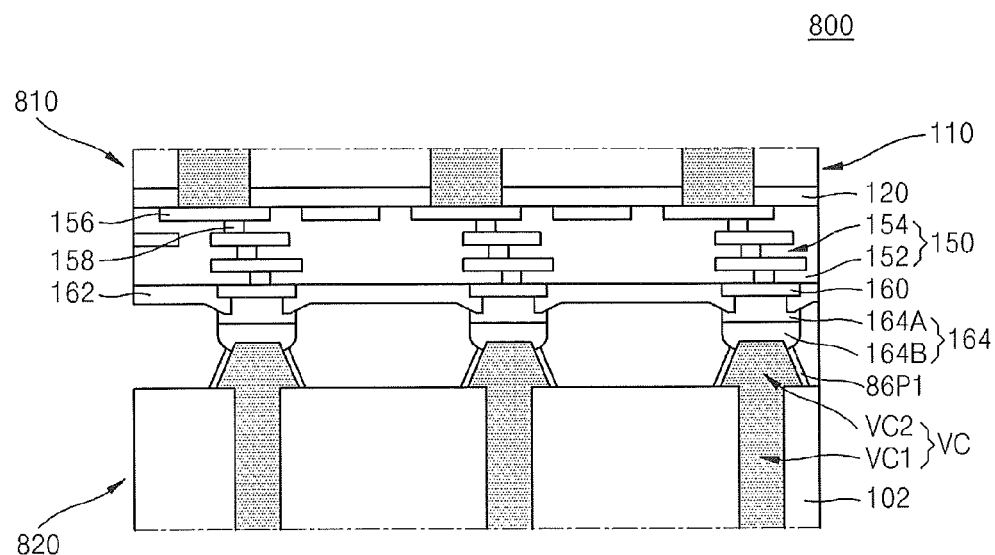
FIG. 8 is a cross-sectional view illustrating an integrated circuit device according to embodiments of the inventive concept.

FIG. 8 is a cross-sectional view for explaining an integrated circuit device 800 according to some embodiments of the inventive concept. In FIG. 8, like reference numerals denote like elements as in FIGS. 1 through 7B, and a detailed description thereof will not be repeated herein to avoid redundancy.

Referring to FIG. 8, the integrated circuit device 800 includes a first semiconductor chip 810 and a second semiconductor chip 820 that are electrically connected to each other.

The first semiconductor chip 810 may include any one of the integrated circuit devices 100, 200, 300, 400, 500, 600 and 700 as described above with reference to FIGS. 1 through 7B, but is not limited thereto, The second semiconductor chip 820 may include any one of the integrated circuit devices 100, 200, 400 and 600 of FIGS, 1, 2P, 4F and 6J, TSV contact patterns VC of the second semiconductor chip 820 are respectively connected electrically to bumps 164 of the first semiconductor chip 810. At least a portion of an external pad part VC2 of each TSV contact pattern VC included in the second semiconductor chip 820 is inserted into each bump 164 formed in the first semiconductor chip 810 to mechanically bond the first semiconductor chip 810 to the second semiconductor chip 820. As such, the external pad part VC2 of each conductive via structure VC defines an integral contact pad that electrically connects the second semiconductor chip 820 to the first semiconductor chip 820 stacked thereon.

Sidewalls of the external pad part VC2 of each TSV contact pattern VC included in the second semiconductor chip 820 are covered by a pad protective layer 86P1 around each bump 164 formed in the first semiconductor chip 810. The pad protective layers 86P1 may be formed of the same material as that of the pad protective layers illustrated in FIG. 2P.

The second semiconductor chip 820 may be obtained from the integrated circuit device 100 including external pad parts VC2 whose external surfaces are covered by pad protective layers 86 as illustrated in FIG. 1, and the integrated circuit device 100 of FIG. 1 may be electrically connected to the first semiconductor chip 810, thereby obtaining the structure illustrated in FIG. 8. To electrically connect the integrated circuit device 100 and the first semiconductor chip 810, in a state where the bumps 164 of the first semiconductor chip 810 and the pad protective layers 86P1 that cover the external pad parts VC2 of the integrated circuit device 100 face with or are otherwise adjacent to each other, the integrated circuit device 100 and the second semiconductor chip 820 are pressed towards each other, thereby inserting a portion of each external pad part VC2 of the integrated circuit device 100 into each bump of the first semiconductor chip 810, While the integrated circuit device 100 and the second semiconductor chip 820 are being pressed towards each other so as to insert a portion of each external pad part VC2 of the integrated circuit device 100 into each bump of the first semiconductor chip 810, a portion of each pad protective layer 86P 1 which contacts each bump 164 of the first semiconductor chip 810 is removed by pressure from the bumps 164 or a chemical reaction due to the formation of plasma so that the bumps 164 and the external pad parts VC2 directly contact each other. In this regard, only the pad protective layer 86P1 that covers the sidewalls of the external pad part VC2 around the bump 164 remains. In some embodiments, a reaction resultant material between a material constituting the pad protective layer 86P1 and a second metal layer 164B may be included around a contact surface between the bump 164 and the external pad part VC2.

Figure 9:
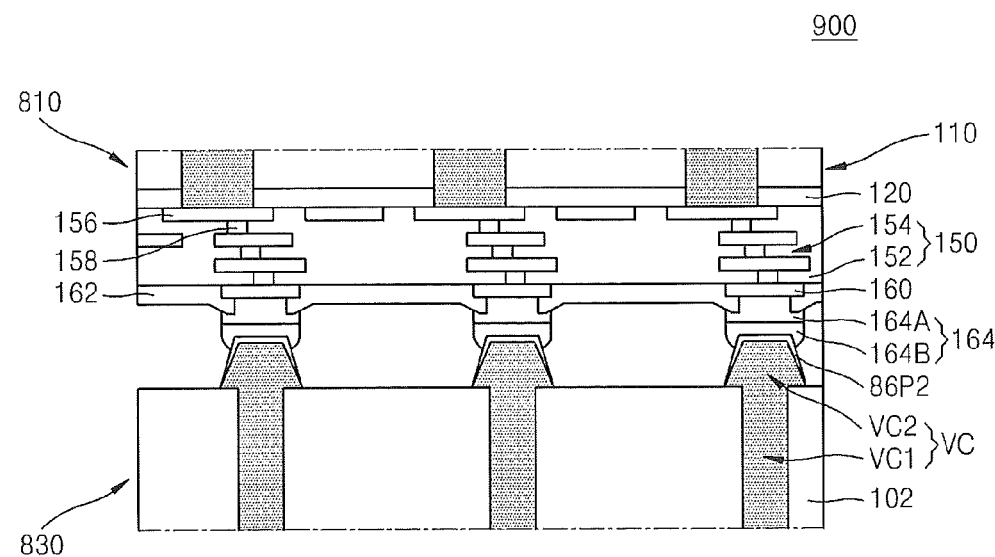
FIG. 9 is a cross-sectional view illustrating an integrated circuit device according to embodiments of the inventive concept.

FIG. 9 is a cross-sectional view for explaining an integrated circuit device 900 according to some embodiments of the inventive concept. In FIG. 9, like reference numerals denote like elements as in FIGS. 1 through 8, and a detailed description thereof will not be repeated herein to avoid redundancy.

Referring to FIG. 9, the integrated circuit device 900 includes a first semiconductor chip 810 and a second semiconductor chip 830 that are electrically connected to each other.

The second semiconductor chip 830 may include any one of the integrated circuit devices 100, 300, 500, and 700 illustrated in FIGS. 1, 3B, 5C, and 7B. In some embodiments, pad protective layers 86P2 each covering an external pad part VC2 of the TSV contact pattern VC may be formed of the same material as that of the first mask patterns 284P subjected to the reflow process as illustrated in FIG. 3B.

The TSV contact patterns VC of the second semiconductor chip 830 are respectively connected electrically to bumps 164 of the first semiconductor chip 810, with the pad protective layers 86P2 therebetween.

A portion of each external pad part VC2 of the second semiconductor chip 830 and a portion of each pad protective layer 86P2 are inserted into the bump 164 of the first semiconductor chip 810. In some embodiments, a distance between the first semiconductor chip 810 and the second semiconductor chip 830 may be maintained such that the pad protective layers 86P2 of the second semiconductor chip 830 are each inserted into the bump 164 of the first semiconductor chip 810 but the external pad parts VC2 are not inserted into the bump 164 of the first semiconductor chip 810.

A top surface and sidewalls of the TSV contact pattern VC of the second semiconductor chip 830 are covered by the pad protective layer 86P2. Thus, the external pad part VC2 included in the TSV contact pattern VC of the second semiconductor chip 830 is electrically connected to the bump 164 of the first semiconductor chip 810, but does not directly contact the bump 164.

To obtain the structure illustrated in FIG. 9 by electrically connecting the first semiconductor chip 810 and the second semiconductor chip 830, in a state where the bumps 164 of the first semiconductor chip 810 and the pad protective layers 86P2 that cover the external pad parts VC2 of the second semiconductor chip 830 face with each other, the first semiconductor chip 810 and the second semiconductor chip 830 are pressed towards each other, thereby inserting a portion of each external pad part VC2 which is covered by the pad protective layer 86P2 into the bump 164 of the first semiconductor chip 810. If the pad protective layer 86P2 is formed of a metal, a state where the pad protective layer 86P2 covers the external pad part VC2 remains due to a relatively strong mechanical resistance of the pad protective layer 86P2 even though the pad protective layer 86P2 is pressed by the bump 164 of the first semiconductor chip 810, and thus, the pad protective layer 86P2 remains between the external pad part VC2 and the bump 164. Intermetallic compounds including the metal constituting the pad protective layer 86P2 may be included around a contact surface between the bump 164 and the external pad part VC2.

In the integrated circuit device 800 of FIG. 8 and the integrated circuit device 900 of FIG. 9, the external pad part VC2 of the second semiconductor chip 820 or 830 are partially inserted into the bump 164 of the first semiconductor chip 810. Thus, when the bumps 164 of the first semiconductor chip 810 and the external pad parts VC2 of the second semiconductor chip 820 or 830 are pressed towards each other to obtain an electrically connecting state, mechanical locking effects in which the mechanical bonding state can remain without a change in a bonding position therebetween may be obtained. Therefore, in a manufacturing process of an integrated circuit device, costs of a bonding process may be reduced and the productivity of the integrated circuit device manufacturing process may be improved.

Figure 10:
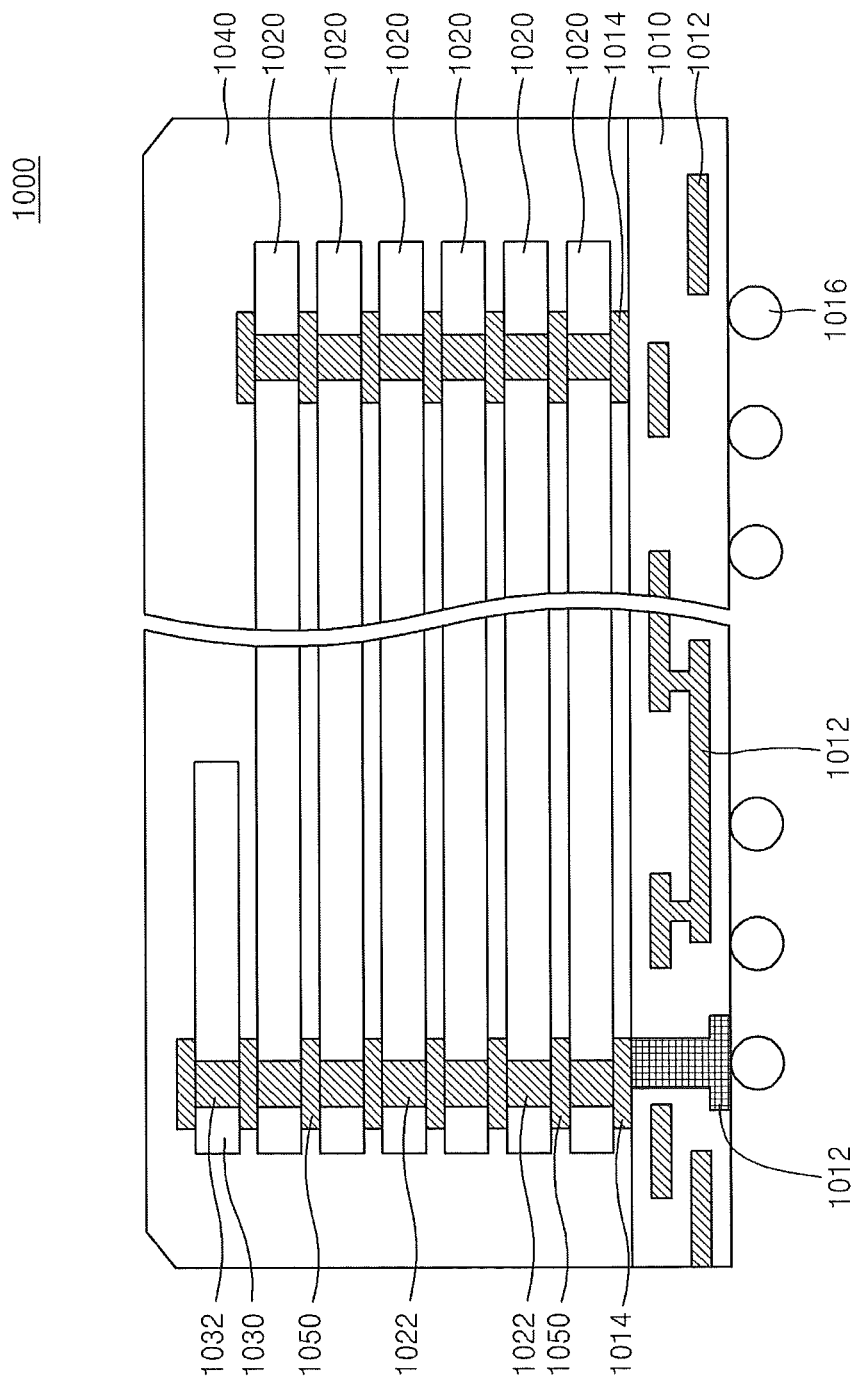
FIG. 10 is a cross-sectional view illustrating elements of an integrated circuit device according to embodiments of the inventive concept.

FIG. 10 is a cross-sectional view illustrating elements of an integrated circuit device 1000 according to some embodiments of the inventive concept.

Referring to FIG. 10, the integrated circuit device 1000 includes a plurality of semiconductor chips 1020 that are sequentially stacked on a package substrate 1010. A control chip 1030 is connected on the plurality of semiconductor chips 1020. The stacked structure of the plurality of semiconductor chips 1020 and the control chip 1030 is encapsulated on the package substrate 1010 by an encapsulant 1040 such as a thermosetting resin. In FIG. 10, a structure in which six semiconductor chips 1020 are vertically stacked is illustrated, but the number of the semiconductor chips 1020 and a stacked direction thereof are not limited to the example illustrated in FIG. 10. If desired, the number of the semiconductor chips 1020 may be adjusted to less or greater than 6. The plurality of semiconductor chips 1020 may be arranged on the package substrate 1010 in a horizontal direction, or may be arranged in a connecting structure of a combination of vertical sealing and horizontal sealing. The control chip 1030 may not be formed.

The package substrate 1010 may be a flexible printed circuit board, a rigid printed circuit board, or a combination thereof. The package substrate 1010 includes a substrate internal wire 1012 and connection terminals 1014. The connection terminals 1014 may be formed on a surface of the package substrate 1010. Solder balls 1016 are formed on another surface of the package substrate 1010. The connection terminals 1014 are electrically connected to the solder balls 1016 via the substrate internal wire 1012.

The solder balls 1016 may be replaced by a conductive bump or a lead grid array (LGA).

At least one of the plurality of semiconductor chip 1020 and the control chip 1030 includes at least one of the integrated circuit devices 100, 200, 300, 400, 500, 600, 700, 800, and 900 as illustrated in FIGS. 1 through 9. In particular, the semiconductor chips 1020 and the control chip 1030 include TSV structures 1022 and a TSV structure 1032, respectively. At least one of the TSV structures 1022 and 1032 includes at least one TSV contact pattern selected from the TSV contact pattern VC illustrated in FIG. 1, the TSV contact pattern including the first TSV contact pattern VA and the second TSV contact pattern VB1 illustrated in FIGS. 2P and 3B, the TSV contact pattern including the first TSV contact pattern VA and the second TSV contact pattern VB2 illustrated in FIGS. 4F and 5C, and the TSV contact pattern VB3 illustrated in FIGS. 6J and 7B.

The TSV structure 1022 or 1032 of each of the semiconductor chips 1020 and the control chip 1030 may be electrically connected to the connection terminal 1014 of the package substrate 1010 by a connecting member 1050. The connecting member 1050 may include a structure that combines or otherwise includes both the bump 164 illustrated in FIGS. 1 through 9 and any one of the external pad parts VC2, VB12, VB22, and VB32.

Each semiconductor chip 1020 may include a system LSI, flash memory, DRAM, SRAM, EEPROM, PRAM, MRAM, or RRAM. The control chip 1030 may include logic circuits such as serializer/deserializer (SER/DES) circuits.

Figure 11:
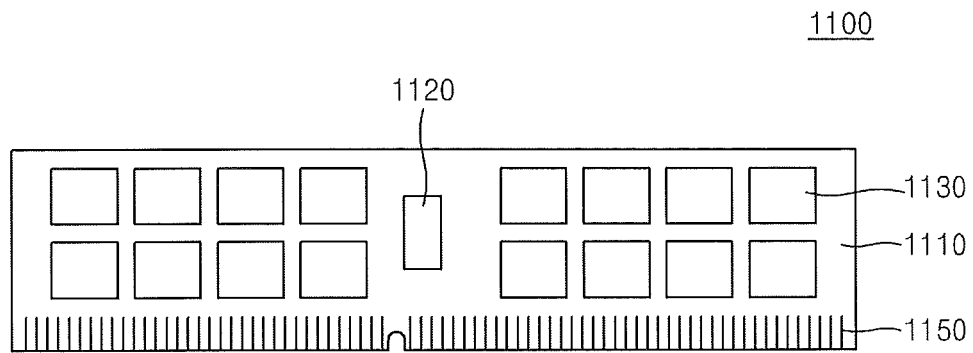
FIG. 11 is a plan view illustrating elements of an integrated circuit device according to embodiments of the inventive concept.

FIG. 11 is a plan view illustrating elements of an integrated circuit device 1100 according to some embodiments of the inventive concept.

The integrated circuit device 1100 includes a module substrate 1110, a control chip 1120 mounted on the module substrate 1110, and a plurality of semiconductor packages 1130. A plurality of input/output terminals 1150 are formed in the module substrate 1110.

The plurality of semiconductor packages 1130 include at least one of the integrated circuit devices 100, 200, 300, 400, 500, 600, 700, 800, 900, and 1000 illustrated in FIGS. 1 through 9. In particular, the plurality of semiconductor packages 1130 include at least one TSV contact pattern selected from the TSV contact pattern VC illustrated in FIG. 1, the TSV contact pattern including the first TSV contact pattern VA and the second TSV contact pattern VB1 illustrated in FIGS. 2P and 3B, the TSV contact pattern including the first TSV contact pattern VA and the second TSV contact pattern VB2 illustrated in FIGS. 4F and 5C, and the TSV contact pattern VB3 illustrated in FIGS. 63 and 7B.

Figure 12:
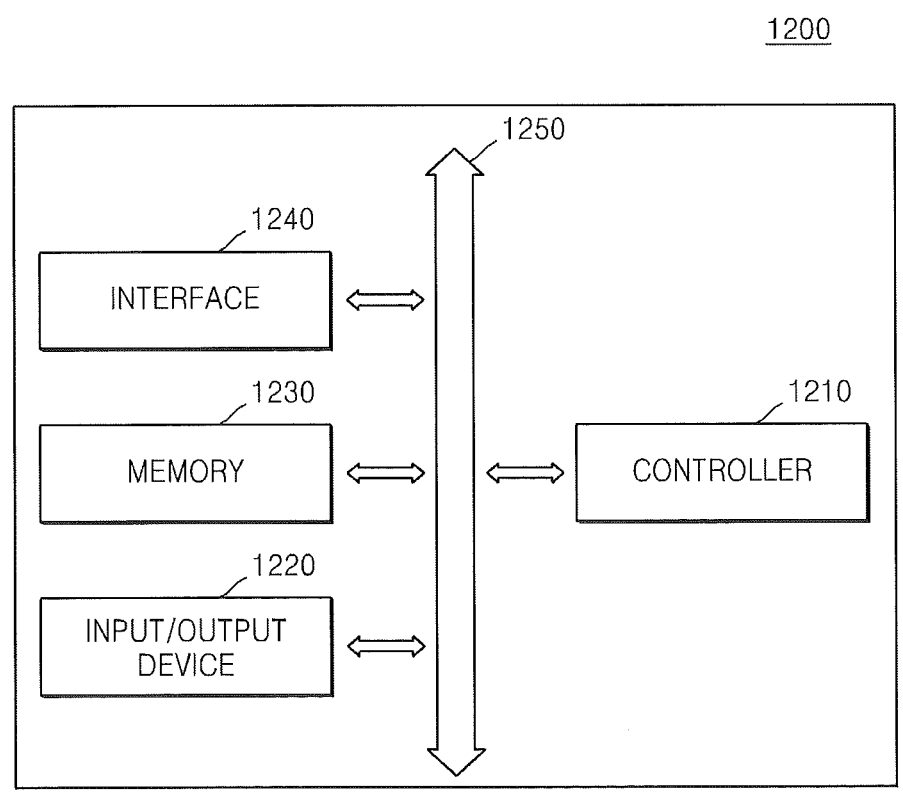
FIG. 12 is a diagram illustrating elements of an integrated circuit device according to embodiments of the inventive concept.

FIG. 12 is a diagram illustrating elements of an integrated circuit device 1200 according to some embodiments of the inventive concept.

The integrated circuit device 1200 includes a controller 1210, an input/output device 1220, a memory 1230, and an interface 1240. The integrated circuit device 1200 may be a mobile system or a system for transmitting or receiving information. In some embodiments, the mobile system may be at least one of a personal digital assistant (PDA), a portable computer, a web tablet, a wireless phone, a mobile phone, a digital music player, or a memory card.

The controller 1210 may be a microprocessor, a digital signal processor, or a micro-controller.

The input/output device 1220 may be used to input and output data to and from the integrated circuit device 1200. The integrated circuit device 1200 may be connected to an external device, for example, a personal computer or a network by using the input/output device 1220, and data exchange between the integrated circuit device 1200 and the external device may be implemented. The input/output device 1220 may be a keypad, a keyboard, or a display device.

The memory 1230 stores codes and/or data for operating the controller 1210. The memory 1230 may also store data processed in the controller 1210. At least one of the controller 1210 and the memory 1230 includes at least one of the integrated circuit devices 100, 200, 300, 400, 500, 600, 700, 800, 900, and 1000 illustrated in FIGS. 1 through 9. In particular, at least one of the controller 1210 and the memory 1230 consists of an electronic system including a semiconductor package including at least one TSV contact pattern selected from the TSV contact pattern VC illustrated in FIG. 1, the TSV contact pattern including the first TSV contact pattern VA and the second TSV contact pattern VB 1 illustrated in FIGS. 2P and 3B, the TSV contact pattern including the first TSV contact pattern VA and the second TSV contact pattern VB2 illustrated in FIGS. 4F and 5C, and the TSV contact pattern VB3 illustrated in FIGS. 6J and 7B.

The interface 1240 acts as a data transmission path between the integrated circuit device 1200 and other external devices. The controller 1210, the input/output device 1220, the memory 1230; and the interface 1240 may communicate with each other via a bus 1250.

Examples of the integrated circuit device 1200 include a mobile phone, a MP3 player, a navigation system, a portable multimedia player (PMP), a solid state disk (SSD), and household appliances.

While the inventive concept has been particularly shown and described with reference to exemplary embodiments thereof, it will be understood that various changes in form and details may be made therein without departing from the spirit and scope of the following claims.

What is claimed is:

1. An integrated circuit device comprising:
   a first semiconductor chip comprising a first substrate, a conductive bump and a wiring pattern on the first substrate, and a conductive via structure extending through the first substrate, wherein the wiring pattern on the first substrate electrically connects the conductive bump to the conductive via structure; and
   a second semiconductor chip comprising a second substrate, an interlayer insulating layer on the second substrate, a wire layer on the interlayer insulating layer, and a through-silicon-via (TSV) contact pattern having an end adjacent the interlayer insulating layer and contacting the wire layer, the TSV contact pattern integrally extending from inside of a via hole that penetrates through the interlayer insulating layer and through the second substrate to outside of the via hole, and being electrically connected to the conductive bump of the first semiconductor chip,
   wherein the TSV contact pattern comprises a unitary member including an internal plug part filling at least a portion of a space within the via hole and an external pad part being integrally connected to the internal plug part, the external pad part extending onto a backside of the second substrate opposite the interlayer insulating layer and having a width that tapers in a direction away from the backside of the second substrate, and wherein at least a portion of the external pad part extends into the conductive bump of the first semiconductor chip and mechanically bonds the second semiconductor chip thereto.

2. The integrated circuit device of claim 1, further comprising:

a pad protective layer comprising an organic material on the external pad part around the conductive bump, or a metal interposed between the bump and the external pad part and on the external pad part.

3. The integrated circuit device of claim 1, wherein the TSV contact pattern comprises:

a first TSV contact pattern contacting the wire layer and filling a portion of a space within the via hole; and a second TSV contact pattern contacting the first TSV contact pattern in the via hole, filling a remaining portion of the space within the via hole, and extending outside of the via hole.

4. The integrated circuit device of claim 3, wherein the first TSV contact pattern comprises a first conductive pattern, a first barrier layer on the first conductive pattern, and a first seed layer interposed between the first conductive pattern and the first barrier layer, wherein the second TSV contact pattern comprises a second conductive pattern, a second barrier layer on the second conductive pattern, and a second seed layer interposed between the second conductive pattern and the second barrier layer, and wherein the first TSV contact pattern and the second conductive pattern are adjacent each other, with the second barrier layer and the second seed layer therebetween.

5. The integrated circuit device of claim 1, wherein the TSV contact pattern comprises a conductive pattern, a barrier layer on the conductive pattern, and a seed layer interposed between the conductive pattern and the barrier layer, wherein the conductive pattern integrally extends from inside of the via hole to outside of the via hole.

* * * * *